(12) United States Patent
Koda et al.

(10) Patent No.: US 9,081,276 B2
(45) Date of Patent: Jul. 14, 2015

(54) PHOTOSENSITIVE RESIN COMPOSITION PRODUCTION KIT, AND USE THEREOF

(75) Inventors: Tomohiro Koda, Otsu (JP); Yoshihide Sekito, Otsu (JP); Tetsuya Kogiso, Otsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 13/876,329

(22) PCT Filed: Jul. 1, 2011

(86) PCT No.: PCT/JP2011/065211
§ 371 (c)(1),
(2), (4) Date: Mar. 27, 2013

(87) PCT Pub. No.: WO2012/043001
PCT Pub. Date: Apr. 5, 2012

(65) Prior Publication Data
US 2013/0189624 A1   Jul. 25, 2013

(30) Foreign Application Priority Data

Sep. 29, 2010  (JP) ................. 2010-219686

(51) Int. Cl.
*G03F 7/033* (2006.01)
*G03F 7/40* (2006.01)
(Continued)

(52) U.S. Cl.
CPC . *G03F 7/004* (2013.01); *C08F 2/50* (2013.01); *C08G 18/10* (2013.01); *C08G 18/44* (2013.01);
(Continued)

(58) Field of Classification Search
CPC ........... C08G 18/6254; C08G 18/6407; C08G 18/10; C08G 18/346; G03F 7/004; G03F 7/033; G03F 7/035; G03F 7/40
USPC .................... 522/33, 39, 46, 53, 57, 109, 170
See application file for complete search history.

(56) References Cited

U.S. PATENT DOCUMENTS 8,492,070 B2 * 7/2013 Kojima et al. ............. 430/270.1
2005/0215656 A1   9/2005 Kojima et al.
(Continued)

FOREIGN PATENT DOCUMENTS

CN   101183212 A   5/2008
CN   101303527 A   11/2008
(Continued)

OTHER PUBLICATIONS

International Search Report for PCT/JP2011/065211 dated Aug. 9, 2011.
(Continued)

*Primary Examiner* — Mark Eashoo
*Assistant Examiner* — Jessica Roswell
(74) *Attorney, Agent, or Firm* — Sughrue Mion, PLLC

(57) ABSTRACT

The object of the present invention is to provide a photosensitive resin composition which is excellent in: storage stability in a long-term storage; microfabricability; developability; low-temperature curability; flexibility in a cured film; electrical insulation reliability; solder heat resistance; resistance to an organic solvent; and flame retardancy and low in post-curing warpage when processed into a substrate. The object can be attained by use of a photosensitive resin composition production kit which includes at least two or more components including an A component and a B component. The A component contains a (A) compound having a carboxyl group. The B component contains a (B) compound having a reactive group which is reactive to a carboxyl group, a (C) oxime ester photopolymerization initiator, and a (D) compound having a photosensitive group but no carboxyl group.

7 Claims, 1 Drawing Sheet

(51) Int. Cl.
- *C08G 18/10* (2006.01)
- *C08G 18/34* (2006.01)
- *G03F 7/004* (2006.01)
- *C08F 2/50* (2006.01)
- *H05K 3/28* (2006.01)
- *C08G 18/75* (2006.01)
- *C08G 59/42* (2006.01)
- *C08G 59/68* (2006.01)
- *C08G 18/44* (2006.01)
- *G03F 7/031* (2006.01)
- *G03F 7/035* (2006.01)

(52) U.S. Cl.
CPC .......... *C08G 18/758* (2013.01); *C08G 59/4269* (2013.01); *C08G 59/68* (2013.01); *G03F 7/031* (2013.01); *G03F 7/033* (2013.01); *G03F 7/035* (2013.01); *G03F 7/40* (2013.01); *H05K 3/287* (2013.01)

(56) References Cited

U.S. PATENT DOCUMENTS

| | | |
|---|---|---|
| 2008/0227883 A1 | 9/2008 | Kojima et al. |
| 2012/0295200 A1 | 11/2012 | Kojima et al. |

FOREIGN PATENT DOCUMENTS

| | | | |
|---|---|---|---|
| CN | 101320212 A | 12/2008 | |
| EP | 1 568 723 | * 11/2003 | ............. C08G 59/40 |
| JP | 2007-171812 A | 7/2007 | |
| JP | 2008-299294 A | 12/2008 | |
| JP | 2010-39389 A | 2/2010 | |
| JP | 2010-113245 A | 5/2010 | |
| WO | 2004/048434 A1 | 6/2004 | |

OTHER PUBLICATIONS

English Translation of the International Preliminary Report on Patentability (Chapter I) of PCT Application No. PCT/JP2011/065211 dated Apr. 25, 2013.

Chinese Office Action issued in application No. 2011800470105 dated Jun. 28, 2014.

* cited by examiner

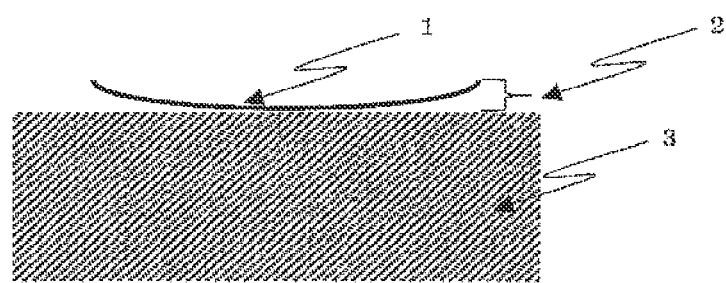

US 9,081,276 B2

PHOTOSENSITIVE RESIN COMPOSITION PRODUCTION KIT, AND USE THEREOF

CROSS REFERENCE TO RELATED APPLICATIONS

This application is a National Stage of International Application No. PCT/JP2011/065211 filed Jul. 1, 2011, claiming priority based on Japanese Patent Application No. 2010-219686 filed Sep. 29, 2010, the contents of all of which are incorporated herein by reference in their entirety.

TECHNICAL FIELD

The present invention relates to a photosensitive resin composition production kit, and to a resin composition, a resin film, an insulation film, and a printed wiring board with an insulation film each of which is obtainable by use of the photosensitive resin composition production kit.

More specifically, the present invention relates to: (i) a photosensitive resin composition production kit which has excellent storage stability in a long-term storage; (ii) a photosensitive resin composition obtainable by use of the photosensitive resin composition production kit, which photosensitive resin composition is excellent in micro fabric ability, develop ability, and low-temperature curability, excellent in flexibility, electrical insulation reliability, solder heat resistance, resistance to an organic solvent, and flame retardancy when processed into a cured film, and low in post-curing warpage when processed into a substrate; and (iii) a resin film, an insulation film, and a printed wiring board with an insulation film each of which is obtainable from the photosensitive composition.

Further, the present invention relates to a method for producing a resin film by use of the photosensitive resin composition production kit and a method for storing compounds composing a photosensitive resin composition.

BACKGROUND ART

Conventionally, in the manufacturing industry of a printed wiring board, a cover lay film has been used as a surface protection material for a flexible circuit substrate, which cover lay film is obtained by applying an adhesive to a shaped article such as polyimide film. In a case where this cover lay film is adhered to a flexible circuit substrate, it is a general practice to form, by punching etc., openings in the cover lay film beforehand so that the openings positionally correspond to places where terminals of circuits are to be located or where parts are to be connected and, after positioning the cover lay film, attach the cover lay film to the flexible circuit substrate by thermocompression bonding such as thermal pressing. Further, the cover lay film is required to have excellent characteristics such as heat resistance, chemical resistance, flame retardancy, adhesiveness, electrical insulation reliability and the like. As to flame retardancy, it is possible to obtain good flame retardancy by using a halogen flame retardant. However, in view of environmental loads, a flame-retarding technique involving no halogen flame retardant is required.

The cover lay film is poor in position accuracy and also low in workability of the attachment because forming an accurate opening is difficult and, further, positioning the cover lay film at a time of attachment is often performed manually. Therefore, a photosensitive solder resist is used in some cases. The use of photosensitive solder resist provides excellent microfabricability to the cover lay film. As the photosensitive solder resist, a photosensitive resin composition which is mainly made of an epoxy resin etc. is used. This photosensitive solder resist is excellent in electrical insulation reliability as an electrical insulation material. However, the photosensitive solder resist has disadvantages in mechanical characteristics such as flexibility, and greatly shrinks at curing. Accordingly, in a case where the photosensitive solder resist is layered on a circuit substrate which is thin and flexible (i.e. a flexible circuit substrate), the circuit substrate is greatly warped. Therefore, it has been difficult to use the photosensitive solder resist for a flexible circuit substrate. Further, the photosensitive solder resist is also poor in flame retardancy. In a case where a flame retardant is added to the photosensitive solder resist so as to increase the flame retardancy, there are problems such as a property deterioration and such as a contact fault and process pollution which occur due to a bleedout in which the flame retardant bleeds from a cured film.

In recent years, various suggestions are made on this photosensitive solder resist.

For example, Patent Literature 1 suggests a flame retardant photocurable resin composition containing a phosphazene compound which is in a liquid state at a room temperature, a carboxyl group containing resin, and a photopolymerization initiator. Further, Patent Literature 2 suggests a flame retardant photocurable resin composition which contains a carboxyl group containing resin, a soluble phosphazene compound which is soluble in a carboxyl group containing resin by 5 wt % or more, and a photopolymerization initiator.

Patent Literature 3 suggests a photocurable and thermosetting resin composition (i) which excels in tack-free dryness, adhesion, and resolution, (ii) which scarvely generates mist during thermal curing, and (iii) which is highly sensitive and excellent in storage stability.

Citation List

[Patent Literature 1]
Japanese Patent Application Publication, Tokukai, No. 2010-39389 A (Publication Date: Feb. 18, 2010)

[Patent Literature 2]
Japanese Patent Application Publication, Tokukai, No. 2010-113245 A (Publication Date: May 20, 2010)

[Patent Literature 3]
Pamphlet of International Application Publication, No. 2004/048434 (International Publication Date: Jun. 10, 2004)

SUMMARY OF INVENTION

Technical Problem

The above Patent Literatures suggest various techniques to solve the problems of the cover lay. However, although the resin compositions disclosed in each of Patent Literatures 1 and 2 is a non-halogen composition from which it is possible to form a cover lay which has light environmental loads and excellent flame retardancy, the resin compositions have a problem in that cured films formed from the resin compositions do not have enough flexibility because the carboxyl group containing resin contains a photosensitive group and, therefore, crosslink density of the cured film is increased. Further, the Patent Literatures 1 and 2 describe that, in a case where a phosphazene compound is stored for a long period under a low-temperature environment after being dissolved by heating, and then cooled, the phosphazene compound thus dissolved recrystallizes and precipitates in a composition. However, Patent Literatures 1 and 2 do not describe effects which are achieved by the present invention, that is, long-term storage stability of photosensitivity and that, in a case where a dissolved oxime ester photopolymerization initiator is stored for a long period under a low-temperature environment, the dissolved oxime ester photopolymerization initiator recrystallizes and precipitates in a composition. In view of these points, the inventions of the Patent Literatures 1 and 2 are essentially different from the invention of the subject application.

Further, according to the photocurable and thermosetting resin composition disclosed in Patent Literature 3, an oxime ester photopolymerization initiator is included in a composition other than a composition in which a carboxyl group containing resin and a reactive diluent are included so that the photocurable and the thermosetting resin composition has at least two-liquid system, and the compositions are mixed before the use of the compositions. Therefore, the oxime ester photopolymerization initiator is prevented from deteriorating due to being in contact with a carboxyl group contained in the carboxyl group containing resin for a long time. Further, since it is possible to prevent the oxime ester photopolymerization initiator, which is highly sensitive, from being in contact with the reactive diluent for a long time, it is considered that reaction of the reactive diluent does not proceed and thus the oxime ester photopolymerization initiator excels in storage stability.

However, the inventors have found a new problem as below regarding the photocurable and thermosetting resin composition disclosed in Patent Literature 3. That is, because an oxime ester photopolymerization initiator is difficult to dissolve in a solvent or the other compositions, long-term storage of the oxime ester photopolymerization initiator under a low-temperature environment results in that the oxime ester photopolymerization initiator which is dissolved recrystallizes and precipitates in the resin composition. This causes a film defect when the resin composition is coated on a substrate. The film defect leads to insufficient photosensitivity. This problem has not been known so far, and is a completely novel problem that the inventors of the present invention have originally found.

Solution to Problem

In order to solve the problems, the inventors have diligently devoted themselves to studies. As a result, the inventors found the following effects can be attained according to a photosensitive resin composition production kit including at least two or more components including an A component and a B component, the A component containing a (A) compound having a carboxyl group, the B component containing a (B) compound having a reactive group which is reactive to a carboxyl group, a (C) oxime ester photopolymerization initiator, and a (D) compound having a photosensitive group but no carboxyl group. That is, the (C) oxime ester photopolymerization initiator is prevented from deteriorating due to being in contact with a carboxyl group contained in the (A) compound having a carboxyl group for a long time, and thus photosensitivity of the photosensitive resin composition production kit does not decrease after the photosensitive resin composition production kit is stored for a long period. Further, the (D) compound having a photosensitive group but no carboxyl group acts as a solvent which dissolves the (C) oxime ester photopolymerization initiator, so that solubility of the (C) oxime ester photopolymerization initiator in the B component is increased. Therefore, even in a case where the photosensitive resin composition production kit is stored for a long period under a low-temperature environment, the (C) oxime ester photopolymerization initiator which is dissolved in the B component is prevented from recrystallizing and precipitating in the B component.

Furthermore, the photosensitive resin composition produced by use of the photosensitive resin composition production kit is: microfabricable because the photosensitive resin composition is photosensitive; developable with rare alkali aqueous solution; curable at a low-temperature (200° C. and less); and excellent in storage stability because the photosensitive resin composition does not suffer decrease in photosensitivity or precipitations after being stored for a long period at low-temperature. Moreover, a cured film obtainable from the photosensitive resin composition has excellent flexibility, electrical insulation reliability, solder heat resistance, resistance to an organic solvent, and flame retardancy. In addition, the warping caused to a substrate due to the curing of the cured film is low. Depending on these findings, the inventors achieved the present invention.

The present invention can solve the problems with the use of the following novel photosensitive resin composition. That is, the invention of the subject application includes a photosensitive resin composition production kit including at least two or more components including an A component and a B component, the A component containing a (A) compound having a carboxyl group, the B component containing a (B) compound having a reactive group which is reactive to a carboxyl group, a (C) oxime ester photopolymerization initiator, and a (D) compound having a photosensitive group but no carboxyl group.

The present invention further includes a photosensitive resin composition produced by use of a photosensitive resin production kit of the present invention, the photosensitive resin composition being obtained by mixing at least two of the A component and the B component together.

Further, a resin film of the present invention is a resin film produced by use of a photosensitive resin composition production kit of the present invention, the resin film being obtained by applying, to a surface of a substrate, a mixture of the at least two or more components including the A component and the B component and then drying the mixture.

Further, an insulation film of the present invention is an insulation film obtained by curing a resin film of the present invention.

Further, a printed wiring board with an insulation film of the present invention is a printed wiring board with an insulation film, wherein the insulation film is an insulation film of the present invention and coats the printed wiring board.

Further, the present invention includes a method for producing a resin film by use of a photosensitive resin composition production kit of the present invention, including: applying, to a surface of a substrate, a mixture containing the at least two components including the A component and the B component; and then drying the mixture.

Further, the present invention includes a method for storing compounds which compose a photosensitive resin composition and which include at least a (A) compound having a carboxyl group, a (B) compound having a reactive group which is reactive to a carboxyl group, an (C) oxime ester photopolymerization initiator, and a (D) compound having a photosensitive group but no carboxyl group, including: preparing two or more components including (i) an A component containing a (A) compound having a carboxyl group and (ii) a B component containing a (B) compound having a reactive group which is reactive to a carboxyl group, an (C) oxime ester photopolymerization initiator, and a (D) compound having a photosensitive group but no carboxyl group; and storing the two or more components in such a way that at least the A component and the B component are stored separately from each other.

Note that Patent Literature 3 describes, in page 5, lines 40 to 45, that "It has been now confirmed, however, that a composition containing the photopolymerization initiator (B) having the oxime linkage represented by the aforementioned general formula (I) incorporated therein together with the aforementioned carboxyl group-containing resin (A) having at least one carboxyl group in its molecule exhibits poor storage stability because the photopolymerization initiator has a pair of unpaired electrons in its nitrogen atom. Further, since the photopolymerization initiator (B) having the oxime linkage represented by the aforementioned general formula (I) exhibits high sensitivity, the contact thereof with the reactive diluent (C) is not preferable in view of the storage stability." Note here that the reactive diluent (C) corresponds to a compound having a photosensitive group because the reactive diluent (C) has an unsaturated double bond. Therefore, the point of the invention of Patent Literature 3 is that both a compound having a carboxyl group and a compound having a photosensitive group are not mixed with a photopolymerization initiator having an oxime linkage. In this point, the present invention is significantly different from the invention of Patent Literature 3.

Advantageous Effects of Invention

The photosensitive resin composition production kit of the present invention does not suffer decrease in photosensitivity or a precipitation after being stored for a long period at a low-temperature. Therefore, the photosensitive resin composition production kit of the present invention has excellent storage stability. The photosensitive resin composition produced by use of the photosensitive resin composition production kit is: microfabricable because the photosensitive resin composition is photosensitive; developable with a rare alkali aqueous solution; curable at a low-temperature (200° C. and less).

Further, the cured film obtainable from the photosensitive resin composition has good properties because the cured film has excellent flexibility, electrical insulation reliability, solder heat resistance, resistance to an organic solvent, and flame retardancy. In addition, the cured film is low in post-curing warpage. Therefore, the photosensitive resin composition of the present invention is usable as a protective film and the like of various circuit substrates, and brings about great effects.

BRIEF DESCRIPTION OF DRAWINGS

FIG. 1 is a view schematically illustrating measurement to gauge how much a film is warped.

DESCRIPTION OF EMBODIMENTS

The photosensitive resin composition production kit in accordance with the present invention includes at least two or more components including an A component and a B component, the A component containing a (A) compound having a carboxyl group, the B component containing a (B) compound having a reactive group which is reactive to a carboxyl group, a (C) oxime ester photopolymerization initiator, and a (D) compound having a photosensitive group but no carboxyl group.

The photosensitive resin composition production kit in accordance with the present invention can be arranged such that the (A) compound having the carboxyl group includes at least one of a (a1) compound having a carboxyl group but no photosensitive group and a (a2) compound having a carboxyl group and a photosensitive group.

The photosensitive resin composition production kit in accordance with the present invention can be arranged such that the (B) compound having a reactive group which is reactive to a carboxyl group is a (b1) epoxy resin.

The photosensitive resin composition production kit in accordance with the present invention is preferably arranged such that at a room temperature (25° C.), the (b1) epoxy resin is in a solid state in the B component.

The photosensitive resin composition production kit in accordance with the present invention is preferably arranged such that the (A) compound having a carboxyl group has such a structure that the carboxyl group is directly bound to an aromatic ring.

Further, the photosensitive resin composition in accordance with the present invention is a photosensitive resin composition produced by use of a photosensitive resin production kit of the present invention, the photosensitive resin composition being obtained by mixing at least two of the A component and the B component together.

Further, the resin film in accordance with the present invention is a resin film produced by use of a photosensitive resin composition production kit of the present invention, the resin film being obtained by applying, to a surface of a substrate, a mixture of the at least two or more components including the A component and the B component and then drying the mixture.

Further, the insulation film in accordance with the present invention is an insulation film obtained by curing a resin film of the present invention.

Further, the printed wiring board with an insulation film in accordance with the present invention is a printed wiring board with an insulation film, wherein the insulation film is an insulation film of the present invention and coats the printed wiring board Further, the present invention includes a method for producing a resin film by use of a photosensitive resin composition production kit of the present invention, including: applying, to a surface of a substrate, a mixture containing the at least two components including the A component and the B component; and then drying the mixture.

Further, the present invention includes a method for storing compounds which compose a photosensitive resin composition and which include at least a (A) compound having a carboxyl group, a (B) compound having a reactive group which is reactive to a carboxyl group, an (C) oxime ester photopolymerization initiator, and a (D) compound having a photosensitive group but no carboxyl group, including: preparing two or more components including (i) an A component containing a (A) compound having a carboxyl group and (ii) a B component containing a (B) compound having a reactive group which is reactive to a carboxyl group, an (C) oxime ester photopolymerization initiator, and a (D) compound having a photosensitive group but no carboxyl group; and storing the two or more components in such a way that at least the A component and the B component are stored separately from each other.

As to the invention of the subject application, the following description specifically discuses (I) the photosensitive resin composition production kit and (II) use of the photosensitive resin composition in order.

(I) Photosensitive Resin Composition Production Kit

It is only necessary that the photosensitive resin composition production kit in accordance with the present invention be a photosensitive resin composition production kit including at least two or more components including an A component and a B component, the A component containing a (A) compound having a carboxyl group, the B component containing a (B) compound having a reactive group which is reactive to a carboxyl group, a (C) oxime ester photopolymerization initiator, and a (D) compound having a photosensitive group but no carboxyl group.

Note that the "photosensitive resin composition production kit" is a kit for producing a photosensitive resin composition and means one capable of producing a photosensitive resin composition by mixing two or more components included in the photosensitive resin composition production kit.

In this specification, the (A) compound having a carboxyl group is referred to as a "(A)", the (B) compound having a reactive group which is reactive to a carboxyl group is referred to as a "(B)", the (C) oxime ester photopolymerization initiator is referred to as a "(C)", and the (D) compound having a photosensitive group but no carboxyl group is referred to as a "(D)", in some cases.

Note here that, in general, a photopolymerization initiator is mostly used as a component of the A component due to its excellent productivity. However, in a case where the (A) compound having a carboxyl group and the (C) oxime ester photopolymerization initiator which are used in the present invention are used as compositions of the A component, deterioration of the (C) is accelerated and thus photosensitivity of the (C) is decreased because the (C) is in contact with a carboxyl group contained in the (A) for a long period. Therefore, storage stability of the (C) is considerably decreased and thus it has not been possible to use the (C) in general compositions in which the (A) is contained.

However, the inventors have found that, although the photosensitive resin composition production kit of the present invention is arranged to use the (C) oxime ester photopolymerization initiator, the photosensitive resin composition production kit has high storage stability because the photosensitive resin composition production kit does not suffer decrease in photosensitivity or a precipitation after being stored for a long period at a low-temperature. Further, the inventors have found that the photosensitive resin composition production kit is excellent in various properties. The inventors guess that this is because of the following reasons. That is, according to the photosensitive resin composition production kit of the present invention, since the (A) compound having a carboxyl group and the (C) oxime ester photopolymerization initiator are contained in the A component and the B component respectively, the (C) is prevented from deteriorating due to being in contact with the (A) for a long period and thus the photosensitivity of the (C) is not decreased. Therefore, the storage stability of the photosensitive resin composition production kit is increased. Further, since the B component contains the (D) compound having a photosensitive group but no carboxyl group, the (C) is prevented from recrystallizing and precipitating in the composition (the B component). Further, since the (A) compound having a carboxyl group and the (B) compound having a reactive group which is reactive to a carboxyl group are contained in the A component and the B component respectively, a reaction caused by contact of the (A) with the (B) for a long period is prevented from proceeding, and thus the storage stability of the photosensitive resin composition production kit is increased.

That is, the inventors hypothesize that the storage stability of the photosensitive resin composition production kit is increased because the following two factors which cause decrease in storage stability are eliminated. A first factor is such that, in a case where the (A) compound having a carboxyl group coexists with the (B) compound having a reactive group which is reactive to a carboxyl group, a reaction of the carboxyl group with the reactive group which is reactive to a carboxyl group gradually proceeds. Further, a second factor is such that, in a case where the (A) compound having a carboxyl group coexist with the (C) oxime ester photopolymerization initiator, an acid atmosphere in which the carboxyl group is present acts as a catalyst and thus an oxime ester is hydrolyzed. Furthermore, the (D) compound having a photosensitive group but no carboxyl group acts as a solvent which dissolves the (C) oxime ester photopolymerization initiator and thus solubility of the (C) in the B component is increased. Therefore, the (C) which is dissolved in the B component is prevented from recrystallizing and precipitating in the composition (the B component) even in a case where the photosensitive resin composition production kit is stored for a long period under a low-temperature environment. On this account, the inventors hypothesize that the storage stability of the photosensitive resin composition production kit is increased. As described above, if the storage stability of the photosensitive resin composition production kit is increased, storage stability of the photosensitive resin composition produced by use of the photosensitive resin composition production kit is increased.

Note that, as described above, it is possible to increase the storage stability of the photosensitive resin composition production kit by (i) preparing at least two or more components including the A component containing the (A) compound having a carboxyl group and the B component containing the (B) compound having a reactive group which is reactive to a carboxyl group, the (C) oxime ester photopolymerization initiator, and the (D) compound having a photosensitive group but no carboxyl group and (ii) at least storing the A component and the B component separately. That is, according to the present invention, it is possible to provide a method for stably storing compounds which compose the photosensitive resin composition and which include the (A) compound having a carboxyl group, the (B) compound having a reactive group which is reactive to a carboxyl group, the (C) oxime ester photopolymerization initiator and the (D) compound having a photosensitive group but no carboxyl group.

The following description discusses the (A) compound having a carboxyl group, the (a1) compound having a carboxyl group but no photosensitive group, the (a2) compound having a carboxyl group and a photosensitive group, the (B) compound having a reactive group which is reactive to a carboxyl group, the (C) oxime ester photopolymerization initiator, the (D) compound having a photosensitive group but no carboxyl group, the other compounds, a method for mixing the A component and the B component, and the like. Note here that, in the present invention, (meth)acrylic acid means acrylic acid and/or methacrylic acid. The same is true for (meth)acrylate.

<(A) Compound Having a Carboxyl Group>

The (A) compound having a carboxyl group used in the present invention is not limit in particular, provided that the (A) compound having a carboxyl group has at least one carboxyl group in its molecule. The (A) compound having a carboxyl group can be the (a1) compound having a carboxyl group but no photosensitive group or can be the (a2) compound having a carboxyl group and a photosensitive group. Further, the (A) compound having a carboxyl group can include solely the (a1) or the (a2), or can include both of the (a1) and the (a2). Furthermore, the carboxyl group can be a carboxylic acid anhydride in which two carboxyl groups are synthesized with dehydration.

In a case where the (A) compound having a carboxyl group is the (a1) compound having a carboxyl group but no photosensitive group, the absence of the photosensitive group means that the concentration of the photosensitive group does not change in accordance with the concentration of the carboxyl group when the concentration of the carboxyl group is adjusted. This makes it possible to independently adjust the concentration of the carboxyl group and the concentration of the photosensitive group, and thus a crosslink density of a cured film obtained by curing the photosensitive resin composition can be controlled not to be increased too much. Therefore, because it is possible to achieve enough flexibility in the cured film obtained by curing the photosensitive resin composition, the (A) compound having a carboxyl group is preferably the (a1) compound having a carboxyl group but no a photosensitive group.

Further, in a case where the (A) compound having a carboxyl group includes both of the (a1) compound having a carboxyl group but no photosensitive group and the (a2) compound having a carboxyl group and a photosensitive group, it is possible to achieve, in good balance, flexibility in a cured film obtained by curing the photosensitive resin composition and photosensitivity of the photosensitive resin composition. Therefore, it is preferable that the (A) compound having a carboxyl group include both of the (a1) and the (a2).

Further, in a case where the carboxyl group contained in the (A) compound having a carboxyl group is directly bound to an aromatic ring, alkali developability and alkali resistance are well-balanced and, therefore, conditions as to a temperature, a time, and the like can be wide-ranged for a developing process. In view of this, it is preferable that the carboxyl group contained in the (A) compound having a carboxyl group be directly bound to an aromatic ring.

In a case where the (A) compound having a carboxyl group used in the present invention is soluble in an organic solvent and its weight average molecular weight is not less than 1,000 and not more 1,000,000 polymers on a polyethylene glycol conversion basis, proper viscosity is added to the photosensitive resin composition. Therefore, film-forming property and thickness-uniformity at a time when the photosensitive resin composition is coated on a substrate are increased, and flexibility and chemical resistance of a cured film to be obtained is increased. For that reason, it is preferable that the (A) compound having a carboxyl group be soluble in an organic solvent and its weight average molecular weight be not less than 1,000 and not more 1,000,000 polymers on a polyethylene glycol conversion basis.

The organic solvent is not limited in particular. Examples of the organic solvent include: sulfoxide solvents such as dimethylsulfoxide and diethylsulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; hexamethylphosphoramide; and γ-butyrolactone. Further, if necessary, each of these organic polar solvents can be used in combination with an aromatic hydrocarbon such as xylene and toluene.

Furthermore, examples of the organic solvent include the following solvents: symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyetane), ethyl diglyme (bis(2-ethoxyethyl)ether), and butyl diglyme (bis(2-butoxyethyl)ether); acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: Carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether.

Organic solvent solubility which is an indicator of solubility in an organic solvent can be measured by parts by weight of a compound having a carboxyl group which dissolves in 100 parts by weight of an organic solvent. In a case where a compound having a carboxyl group which dissolves in 100 parts by weight of an organic solvent is 5 parts by weight and more, the compound having a carboxyl group is soluble in the organic solvent. A method for measuring the organic solvent solubility is not limited in particular. For example, the organic solvent solubility can be measured by adding 5 parts by weight of a compound having a carboxyl group to 100 parts by weight of an organic solvent, stirring a resulting solvent for one hour at 40° C., leaving the solvent for 24 hours and more after cooling the solvent to a room temperature, and then checking if the solvent is uniform with including no undissolved substances or no precipitations.

The weight average molecular weight can be measured for example by the following method.

(Measurement of Weight Average Molecular Weight)
Apparatus used: an equivalent to Tosoh HLC-8220GPC
Column: Tosoh TSK gel Super AWM-H (6.0 mm I.D.×15 cm)×2
Guard column: Tosoh TSK guard column Super AW-H
Carrier Solution: 30 mM LiBr+20 mM $H_3PO_4$ in DMF
Flow rate: 0.6 mL/min
Column temperature: 40° C.
Detecting conditions: RI: polarity (+), response (0.5 sec)
Sample concentration: Approximate 5 mg/mL
Control: PEG (polyethylene glycol)

By controlling the weight average molecular weight so as to fall within the foregoing range, a cured film to be obtained excels in flexibility and chemical resistance. Therefore, it is preferable to control the weight average molecular weight so as to fall within the foregoing range. In a case where the weight average molecular weight is 1,000 or less, flexibility and chemical resistance of a cured film to be obtained may be too low. In a case where the weight average molecular weight is 1,000,000 or more, viscosity of the photosensitive resin composition may be too high.

<(a1) Compound Having a Carboxyl Group but No Photosensitive Group>

The (a1) compound having a carboxyl group but no photosensitive group of the present invention is a compound which has at least one carboxyl group in its molecule and has no photosensitive group. Since the (a1) includes no photosensitive group, the concentration of the photosensitive group does not change in accordance with the concentration of the carboxyl group when the concentration of the carboxyl group is adjusted, and thus it is possible to independently adjust concentration of the carboxyl group and the concentration of the photosensitive group. Therefore, because a crosslink density of a cured film obtained by curing the photosensitive resin composition can be controlled not to be increased too much, it is possible to achieve enough flexibility in the cured film. In view of this, the (a1) is preferable.

The (a1) is not limited in particular. Examples of the (a1) include a carboxyl group containing (meth)acrylic copolymer, a carboxyl group containing vinyl copolymer, acid-modified polyurethane, acid-modified polyester, acid-modified polycarbonate, acid-modified polyamide, and acid-modified polyimide. Each of these components can be used solely, or two or more of these components can be used in combination. In view of developability of the photosensitive resin composition and flexibility, chemical resistance and the like of a cured film to be obtained, a carboxyl group containing (meth)acrylic copolymer, acid-modified polyurethane, acid-modified polyamide, and acid-modified polyimide are preferable.

Specifically, the carboxyl group containing (meth)acrylic copolymer is for example a homopolymer or a copolymer each of which has a carboxyl group and a double bond capable of causing copolymerization, the homopolymer or the copolymer being of (meth)acrylic acid, propiolic acid, crotonic acid, isocrotonic acid, myristoleic acid, palmitoleic acid, oleic acid, elaidic acid, vaccenic acid, gadoleic acid, eicosenoic acid, erucic acid, nervonic acid, ω-carboxy-polycaprolactone mono(meth)acrylate, phthalic acid monohydroxyethyl (meth)acrylate, (meth)acrylic acid dimer, 2-(meth) acryloyloxypropyl hexahydrophthalate, 2-(meth)acryloyloxyethyl succinic acid, maleic acid, fumaric acid, citraconic acid, mesaconic acid, atropic acid, cinnamic acid, linoleic acid, eicosadienoic acid, docosadienoic acid, linolenic acid, pinolenic acid, eleostearic acid, mead acid, dihomo-Y-linolenic acid, eicosatrienoic acid, stearidonic acid, arachidonic acid, eicosatetraenoic acid, adrenic acid, bosseopentaenoic acid, eicosapentaenoic acid, osbond acid, clupanodonic acid, tetracosapentaenoic acid, docosahexaenoic acid, nisinic acid, 2,2,2-trisacryloyloxymethyl succinic acid, and 2-trisacryloyloxymethylethyl phthalic acid. Further, an example of the carboxyl group containing (meth)acrylic copolymer is a copolymer into which a compound having a double bond capable of causing copolymerization is added, the compound including: alkyl ester (meth)acrylate such as methyl (meth)acrylate, ethyl (meth)acrylate, butyl (meth)acrylate, isobutyl (meth)acrylate, tertiary butyl (meth)acrylate, hexyl (meth)acrylate, 2-ethylhexyl (meth) acrylate, octyl (meth)acrylate, nonyl (meth)acrylate, decyl (meth)acrylate, dodecyl (meth)acrylate, and stearyl (meth) acrylate; acrylamide such as diacetone acrylamide; ester of vinyl alcohol such as acrylonitrile and vinyl-n-butyl ether; tetrahydrofurfuryl ester (meth)acrylate; dimethylaminoethyl ester (meth)acrylate; diethylaminoethyl ester (meth)acrylate; glycidyl ester (meth)acrylate; 2,2,2-trifluoroethyl (meth) acrylate; 2,2,3,3-tetrafluoropropyl (meth)acrylate; styrene; and vinyltoluene. It is possible to obtain the homopolymer and the copolymers by carrying out homopolymerization and copolymerization by generating a radical with the use of a radical polymerization initiator. Examples of the radical polymerization initiator include: azo compounds such as azobisisobutyronitrile, azobis(2-methyl butyronitrile), and 2,2'-azobis-2,4-dimethyl valeronitrile; organic peroxides such as t-butyl hydroperoxide, cumene hydroperoxide, benzoyl peroxide, dicumyl peroxide, and di-t-butyl peroxide; persulfates such as potassium persulfate, sodium persulfate, and ammonium persulfate; and hydrogen peroxides. Each of these compounds can be used solely, or two or more of these compounds can be used in combination.

The acid-modified polyimide is obtained for example by carrying out a reaction between a diisocyanate compound and tetracarboxylic dianhydride. By adding tetracarboxylic dianhydride in an amount greater than an equivalent amount with respect to a diisocyanate compound, a compound having a terminal carboxylic anhydride and an imide bond is obtained. Further, by causing the compound having terminal carboxylic anhydride to react with water and/or primary alcohol, it is possible to obtain a carboxylic acid compound. Note that the primary alcohol is not limit in particular, and for example methanol, ethanol, propanol, butanol or the like can be preferably used.

Examples of the diisocyanate compound are not limited to any particular one, but encompass: aromatic diisocyanate compounds such as diphenylmethane-2,4'-diisocyanate; 3,2'-, 3,3'-, 4,2'-, 4,3'-, 5,2'-, 5,3'-, 6,2'-, or 6,3'-dimethyldiphenylmethane-2,4'-diisocyanate; 3,2'-, 3,3'-, 4,2'-, 4,3'-, 5,2'-, 5,3'-, 6,2'-, or 6,3'-diethyldiphenylmethane-2, 4'-diisocyanate; 3,2'-, 3,3'-, 4,2'-, 4,3'-, 5,2'-, 5,3'-, 6,2'-, or 6,3'-dimethoxydiphenylmethane-2,4'-diisocyanate, diphenylmethane-4,4'-diisocyanate; diphenylmethane-3,3'-diisocyanate; diphenylmethane-3,4'-diisocyanate; diphenyl ether-4,4'-diisocyanate; benzophenone-4,4'-diisocyanate; diphenylsulfone-4,4'-diisocyanate; tolylene-2,4-diisocyanate; tolylene-2,6-diisocyanate; m-xylylene diisocyanate; p-xylylene diisocyanate; naphthalene-2,6-diisocyanate; and 4,4'-[2,2-bis(4-phenoxyphenyl)propane] diisocyanate; alicyclic group diisocyanate compounds such as hydrogenated diphenylmethane diisocyanate; hydrogenated xylylene diisocyanate; isophorone diisocyanate; and norbornene diisocyanate; and aliphatic diisocyanate compounds such as hexamethylene diisocyanate; trimethyl hexamethylene diisocyanate; and lysine diisocyanate. Moreover, the diisocyanate compound can be a reactant that reacts with a compound containing at least two functional groups reactive with an isocyanate group of a diisocyanate compound. An example of the reactant is a terminal isocyanate group compound (i) reactive with a diol compound and (ii) having a urethane bond. Such reactants and compounds can be used individually or in combination of at least two types thereof.

While examples of the tetracarboxylic acid dianhydride are not limited to any particular one, the tetracarboxylic acid dianhydride is preferably aromatic, and is more preferably tetracarboxylic acid dianhydride in which an anhydrous carboxyl group is directly bound to the aromatic ring. Examples of such a tetracarboxylic acid dianhydride encompass tetracarboxylic acid dianhydrides such as 3,3',4,4'-benzophenone tetracarboxylic acid dianhydride; pyromellitic acid dianhydride; 3,3',4,4'-oxydiphthalic acid dianhydride; 2,2-bis[4-(3, 4-dicarboxyphenoxy)phenyl]propane dianhydride; 2,2-bis (4-hydroxyphenyl)propane dibenzoate-3,3',4,4'-tetracarboxylic acid dianhydride; 3,3',4,4'-diphenylsulfone tetracarboxylic acid dianhydride; 3,3',4,4'-biphenyl tetracarboxylic acid dianhydride; 2,3,3',4-biphenyl tetracarboxylic acid dianhydride; and 5-(2,5-dioxotetrahydro-3-furyl)-3-methyl-3-cyclohexene-1,2-dicarboxylic acid anhydride. Such tetracarboxylic acid dianhydrides can be used individually or in combination of two types thereof.

The acid-modified polyamide is obtained by, for example, a reaction between a diamino compound and tetracarboxylic acid dianhydride, and is a compound having an amino acid structure.

Examples of the diamino compound are not limited to any particular one, and encompass: diaminophenols such as m-phenylenediamine; o-phenylenediamine; p-phenylenediamine; m-aminobenzylamine; p-aminobenzylamine; bis(3-aminophenyl)sulfide; (3-aminophenyl)(4-aminophenyl)sulfide; bis(4-aminophenyl)sulfide; bis(3-aminophenyl) sulfoxide; (3-aminophenyl)(4-aminophenyl)sulfoxide; bis (4-aminophenyl)sulfoxide; bis(3-aminophenyl)sulfone; (3-aminophenyl)(4-aminophenyl)sulfone; bis(4-aminophenyl)sulfone; 3,4'-diaminobenzophenone; 4,4'-diaminobenzophenone; 3,3'-diaminobenzophenone; 3,3'-diaminodiphenylmethane; 3,4'-diaminodiphenylmethane; 4,4'-diaminodiphenylmethane; 4,4'-diaminodiphenyl ether; 3,3'-diaminodiphenyl ether; 3,4'-diaminodiphenyl ether; bis[4-(3-aminophenoxy) phenyl]sulfoxide; bis[4-(aminophenoxy) phenyl]sulfoxide; [(4-aminophenoxyphenyl)(3-aminophenoxyphenyl)phenyl]sulfoxide; bis[4-(3-aminophenoxy)phenyl]sulfone; bis[4-(4-aminophenoxy) phenyl]sulfone; [(4-aminophenoxyphenyl)(3-aminophenoxyphenyl)phenyl]sulfone; bis[4-(3-aminophenoxy)phenyl]sulfide; bis[4-(aminophenoxy) phenyl]sulfide; [(4-aminophenoxyphenyl)(3-aminophenoxyphenyl)phenyl]sulfide; 3,3'-diaminobenzanilide; 3,4'-diaminobenzanilide; 4,4'-diaminobenzanilide; bis[4-(3-aminophenoxy)phenyl] methane; bis[4-(4-aminophenoxy)phenyl]methane; [4-(4-aminophenoxyphenyl)][4-(3-aminophenoxyphenyl] methane; 1,1-bis[(4-(3-aminophenoxy)phenyl]ethane; 1,1-bis[(4-(4-aminophenoxy)phenyl]ethane; 1,1-[4-(4-aminophenoxyphenyl)][4-(3-aminophenoxyphenyl)]ethane; 1,2-bis[(4-(3-aminophenoxy)phenyl]ethane; 1,2-bis[(4-(4-aminophenoxy)phenyl]ethane; 1,2-[4-(4-aminophenoxyphenyl)][4-(3-aminophenoxyphenyl)]ethane; 2,2-bis[(4-(3-aminophenoxy)phenyl)]propane; 2,2-bis[(4-(4-aminophenoxy) phenyl]propane; 2,2-[4-(4-aminophenoxyphenyl)][4-(3-aminophenoxyphenyl)]propane; 2,2-bis[3-(3-aminophenoxy)phenyl]-1,1,1,3,3,3-hexafluoropropane; 2,2-bis[4-(4-aminophenoxy)phenyl]-1,1,1,3,3,3-hexafluoropropane; 2,2-[4-(4-aminophenoxyphenyl)][4-(3-aminophenoxyphenyl)]-1,1,1,3,3,3-hexafluoropropane; 1,3-bis(3-aminophenoxy)benzene; 1,4-bis(3-aminophenoxy) benzene; 1,4-bis(4-aminophenoxy)benzene; 1,3-bis(4-aminophenoxy)benzene; 4,4'-bis(4-aminophenoxy) biphenyl; 4,4'-bis(3-aminophenoxy)biphenyl; bis[4-(3-aminophenoxy)phenyl]ketone; bis[4-(4-aminophenoxy) phenyl]ketone; bis[4-(3-aminophenoxy)phenyl]ether; bis[4-(4-aminophenoxy)phenyl]ether; polytetramethylene oxide-di-P-aminobenzoate; poly(tetramethylene/3-methyltetramethylene ether) glycol bis(4-aminobenzoate); trimethylene-bis(4-aminobenzoate); p-phenylene-bis(4-aminobenzoate); m-phenylene-bis(4-aminobenzoate); bisphenol A-bis(4-aminobenzoate); 2, 4-diaminobenzoic acid; 2,5-diaminobenzoic acid; 3,5-diaminobenzoic acid; 3,3'-diamino-4,4'-dicarboxybiphenyl; 4,4'-diamino-3,3'-dicarboxybiphenyl; 4,4'-diamino-2,2'-dicarboxybiphenyl; [bis(4-amino-2-carboxy)phenyl]methane; [bis(4-amino-3-carboxy)phenyl methane; [bis(3-amino-4-carboxy)phenyl]methane; [bis(3-amino-5-carboxy)phenyl]methane; 2,2-bis[(3-amino-4-carboxyphenyl)]propane; 2,2-bis[(4-amino-3-carboxyphenyl)]propane; 2,2-bis[(3-amino-4-carboxyphenyl)]hexafluoropropane; 2,2-bis[(4-amino-3-carboxyphenyl)]hexafluoropropane; 3,3'-diamino-4,4'-dicarboxydiphenyl ether; 4,4'-diamino-3,3'-dicarboxydiphenyl ether; 4,4'-diamino-2,2'-dicarboxydiphenyl ether; 3,3'-diamino-4,4'-dicarboxydiphenyl sulfone; 4,4'-diamino-3,3'-dicarboxydiphenyl sulfone; 4,4'-diamino-2,2'-dicarboxydiphenyl sulfone; 2,3-diaminophenol; 2,4-diaminophenol; 2,5-diaminophenol; and 3,5-diaminophenol; hydroxy biphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2', 5,5'-tetrahydroxybiphenyl; dihydroxydiphenyl methanes such as 3,3'-diamino-4,4'-dihydroxydiphenyl methane, 4,4'-diamino-3,3'-dihydroxydiphenyl methane, and 4,4'-diamino-2,2'-dihydroxydiphenyl methane; bis[hydroxyphenyl]propanes such as 2,2-bis[(3-amino-4-hydroxyphenyl)]propane and 2,2-bis[(4-amino-3-hydroxyphenyl)]propane; bis[hydroxyphenyl]hexafluoropropanes such as 2,2-bis[(3-amino-4-hydroxyphenyl)]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[(4-(4-amino-3-hydroxyphenoxy)phenyl)]propane; bis(hydroxyphenoxy)biphenyl compounds such as 4,4'-bis (4-amino-3-hydroxyphenoxy)biphenyl; bis[(hydroxyphenoxy)phenyl]sulfone compounds such as 2,2-bis[(4-(4-amino-3-hydroxyphenoxy)phenyl]sulfone; and bis (hydroxyphenoxy)biphenyl compounds such as 4,4'-diamino-3,3'-dihydroxydiphenyl methane, 4,4'-diamino-2, 2'-dihydroxydiphenyl methane, 2,2-bis[(3-amino-4-carboxyphenyl)]propane, and 4,4'-bis(4-amino-3-hydroxyphenoxy)biphenyl. These diamino compounds can be used individually or in combination of two types thereof.

As the tetracarboxylic dianhydride, the same compounds as those for the acid-modified polyimide can be used. Each of the compounds can be used solely, or two or more of the compounds can be used in combination.

The (a1) compound having a carboxyl group but no photosensitive group can be obtained by a reaction in which no solvent is used. However, it is preferable to cause a reaction with the use of an organic solvent in order to control the reaction. The organic solvent can be any one of the ones listed above, for example.

An amount of the organic solvent used in the reaction is preferably such an amount that a solute weight concentration in a reaction solution, that is, a solution concentration, is not less than 5% by weight and not more than 90% by weight. The solute weight concentration in the reaction solution is further preferably in a range of not less than 20% by weight to not more than 70% by weight. If the solution concentration is not more than 5%, it becomes difficult to carry out a polymerization reaction, which therefore causes decrease in a reaction rate, and further may result in not obtaining a substance with a desired structure. Further, if the solution concentration is not less than 90% by weight, the reaction solution becomes highly viscous, and this may result in that the reaction takes place non-uniformly.

<(a2) Compound Having Carboxyl Group and Photosensitive Group>

The (a2) compound having a carboxyl group and a photosensitive group of the present invention is a compound having at least one carboxyl group and photosensitive group in its molecule. In a case where the (a2) is used together with the (a1), it is possible to achieve, in good balance, flexibility in a cured film obtained by curing the photosensitive resin composition and the photosensitivity of the photosensitive resin composition. Therefore, it is preferable that the (a1) and the (a2) are used together.

The (a2) is not limited in particular, and can be for example epoxy acrylate. The epoxy acrylate is obtained by adding saturated or unsaturated polyvalent carboxylic acid anhydride to ester which is obtained by reacting an epoxy compound with unsaturated monocarboxylic acid. Examples of the saturated or unsaturated polybasic acid anhydride include anhydrides such as phthalic acid, tetrahydrophthalic acid, hexahydrophthalic acid, maleic acid, succinic acid, and trimellitic acid. Further, the (a2) can be for example urethane acrylate which is a polymer of (i) a diol compound having an unsaturated ethylene group and/or a carboxyl group and (ii) a diisocyanate compound. Alternatively, the (a2) can be an acrylated acrylate. The acrylated acrylate is obtained by obtaining a copolymer from (i) a (meth)acrylic acid having a carboxyl group and a double bond capable of copolymerization and (ii) a (meth)acrylic ester or the like, and by reacting a part of the carboxyl groups on a side chain with epoxy groups contained in a compound having a (meth)acrylic group and an epoxy group such as glycidyl methacrylate. Examples of the epoxy acrylate include ZFR series, ZAR series, ZCR series, CCR series, and PCR series each of which is produced by Nippon Kayaku Co., Ltd. Examples of the urethane acrylate include UXE series produced by Nippon Kayaku Co., Ltd. Examples of the acrylated acrylate include Cyclomer ACA series produced by DAICEL-CYTEC Company Ltd.

The (a2) compound having a carboxyl group and a photosensitive group is preferably contained by 10 to 200 parts by weight where the (a1) is 100 parts by weight, in view of increase in the photosensitivity of the photosensitive resin composition. In a case where the (a2) is contained in an amount less than the above range, alkali resistance of a cured coating film obtained by photo-curing the photosensitive resin composition may be too low, and further contrast may not be easily obtained when the photosensitive resin composition is exposed and developed. On the other hand, in case where the (a2) is contained in an amount more than the above range, productivity would be possibly decreased due to excess viscosity of a coating film obtained by applying the photosensitive resin composition on a substrate and drying solvents of the photosensitive resin composition. Further, in this case, a cured film to be obtained would possibly become fragile and easily break because a crosslink density is increased too much. Therefore, by containing the (a2) in an amount in the above range, it becomes possible to cause a resolution to fall within the most suitable range as a result of the exposure and development.

<(B) Compound Having a Reactive Group which is Reactive to a Carboxyl Group>

The (B) compound having a reactive group which is reactive to a carboxyl group of the present invention is not limited in particular, provided that the (B) compound having a reactive group which is reactive to a carboxyl group includes, in its molecule, at least one reactive group which is reactive to a carboxyl group. Note here that examples of the reactive group which is reactive to a carboxyl group include epoxy group, oxetanyl group, isocyanate group, amino group, and hydroxyl group, and the reactive group which is reactive to a carboxyl group may be any one of monomer, oligomer, and polymer. Further, the (B) compound having a reactive group which is reactive to a carboxyl group is contained in the B component other than the A component containing the (A) compound having a carboxyl group. By containing the (B) as such, it is possible to suppress a reaction progress caused by contact of the (A) and the (B) for a long period. Therefore, the storage stability of the photosensitive resin composition production kit is increased.

In the case where the (B) compound having a reactive group which is reactive to a carboxyl group of the present invention is the (b1) epoxy resin, a cured film obtained by curing the photosensitive resin composition has excellent heat resistance and electrical insulation reliability. Therefore, the (B) compound having a reactive group which is reactive to a carboxyl group is preferably the (b1) epoxy resin. The epoxy resin is a resin having at least one epoxy group in its molecule, and is not limited in particular. Examples of the epoxy resin include bisphenol A type epoxy resin, bisphenol F type epoxy resin, bisphenol S type epoxy resin, hydrogenated bisphenol A type epoxy resin, biphenyl type epoxy resin, phenoxy type epoxy resin, naphthalene type epoxy resin, phenol novolac type epoxy resin, cresol novolac type epoxy resin, trisphenolmethane type epoxy resin, dicyclopentadiene type epoxy resin, amine type epoxy resin, flexible type epoxy resin, urethane-modified epoxy resin, rubber-modified epoxy resin, chelate-modified epoxy resin, and heterocyclic ring containing epoxy resin. Examples of the bisphenol A type epoxy resins include epoxy resins under: product names jER828, jER1001, jER1002, produced by Japan Epoxy Resins Co., Ltd.; product names ADEKA RESIN EP-4100E, ADEKA RESIN EP-4300E produced by ADEKA Corporation; product names RE-3105, RE-410S produced by Nippon Kayaku Co., Ltd.; product names EPICLON 840S, EPICLON 850S, EPICLON 1050, EPICLON 7050 produced by DIC Corporation; and product names EPOTORT YD-115, EPOTORT YD-127, EPOTORT YD-128 produced by Tohto Kasei Co., Ltd. Examples of the bisphenol F type epoxy resin include epoxy resins under: product names jER806, jER807 produced by Japan Epoxy Resins Co., Ltd.; product names ADEKA RESIN EP-4901E, ADEKA RESIN EP-4930, ADEKA RESIN EP-4950 produced by ADEKA Corporation; product names RE-303S, RE-3045, RE-403S, RE-404S produced by Nippon Kayaku Co., Ltd.; product names EPICLON 830, EPICLON 835 produced by DIC Corporation; and product names EPOTORT YDF-170, EPOTORT YDF-175S, EPOTORT YDF-2001 produced by Tohto Kasei Co., Ltd. An example of the bisphenol S type epoxy resin is an epoxy resin under product name EPICLON EXA-1514 produced by DIC Corporation. Examples of the hydrogenated bisphenol A type epoxy resin include epoxy resins under: product names jERYX8000, jERYX8034, jERYL7170 produced by Japan Epoxy Resins Co., Ltd.; product name ADEKA RESIN EP-4080E produced by ADEKA Corporation; product name EPICLON EXA-7015 produced by DIC Corporation; and product names EPOTORT YD-3000, EPOTORT YD-4000D produced by Tohto Kasei Co., Ltd. Examples of the biphenyl type epoxy resin include epoxy resins under: product names jERYX4000, jERYL6121H, jERYL6640, jERYL6677 produced by Japan Epoxy Resins Co., Ltd.; and product names NC-3000, NC-3000H produced by Nippon Kayaku Co., Ltd. Examples of the phenoxy type epoxy resin include epoxy resins under product names jER1256, jER4250, jER4275 produced by Japan Epoxy Resins Co., Ltd. Examples of the naphthalene type epoxy resin include epoxy resins under: product names EPICLON HP-4032, EPICLON HP-4700, EPICLON HP-4200 produced by DIC Corporation; and product name NC-7000L produced by Nippon Kayaku Co., Ltd. Examples of the phenol novolac type epoxy resin include epoxy resins under: product names jER152, jER154 produced by Japan Epoxy Resins Co., Ltd.; product name EPPN-201-L produced by Nippon Kayaku Co., Ltd.; product names EPICLON N-740, EPICLON N-770 produced by DIC Corporation; and product name EPOTORT YDPN-638 produced by Tohto Kasei Co., Ltd. Examples of the cresol novolac type epoxy resin include epoxy resins under: product names EOCN-1020, EOCN-102S, EOCN-103S, EOCN-104S produced by Nippon Kayaku Co., Ltd.; and product names EPICLON N-660, EPICLON N-670, EPICLON N-680, EPICLON N-695 produced by DIC Corporation. Examples of the trisphenolmethane type epoxy resin include epoxy resins under product names EPPN-501H, EPPN-501HY, EPPN-502H produced by Nippon Kayaku Co., Ltd. Examples of the dicyclopentadiene type epoxy resin include epoxy resins under: product name XD-1000 produced by Nippon Kayaku Co., Ltd.; and product name EPICLON EP-7200 produced by DIC Corporation. Examples of the amine type epoxy resin include epoxy resins under: product names jER604, jER630 produced by Japan Epoxy Resins Co., Ltd.; product names EPOTORT YH-434, EPOTORT YH-434L produced by Tohto Kasei Co., Ltd.; and product names TETRAD-X, TETRAD-C produced by MITSUBISHI GAS CHEMICAL COMPANY, INC. Examples of the flexible type epoxy resin include epoxy resins under: product names jER871, jER872, jERYL7175, jERYL7217 produced by Japan Epoxy Resins Co., Ltd.; and product name EPICLON EXA-4850 produced by DIC Corporation. Examples of the urethane-modified epoxy resin include epoxy resins under product names ADEKA RESIN EPU-6, ADEKA RESIN EPU-73, ADEKA RESIN EPU-78-11 produced by ADEKA Corporation. Examples of the rubber-modified epoxy resin include epoxy resins under product names ADEKA RESIN EPR-4023, ADEKA RESIN EPR-4026, ADEKA RESIN EPR-1309 produced by ADEKA Corporation. Examples of the chelate-modified epoxy resin include epoxy resins under product names ADEKA RESIN EP-49-10, ADEKA RESIN EP-49-20 produced by ADEKA Corporation. An example of the heterocyclic ring containing epoxy resin is an epoxy resin under product name TEPIC produced by Nissan Chemical Industries, Ltd. Each of these epoxy resins can be used solely, or two or more of these epoxy resins can be used in combination. Above all, in a case where the (b1) epoxy resin is in the B component in a solid state at a room temperature (25° C.), the (C) oxime ester photopolymerization initiator contained in the B component less deteriorates, and thus the photosensitive resin composition does not suffer decrease in photosensitivity and excels in storage stability in long-term storage. Therefore, it is preferable that the (b1) epoxy resin be in the B component in a solid state at a room temperature (25° C.). Examples of such (b1) epoxy resin include epoxy resins under: product names jERYX4000, jERYX4000K, jERYX4000H, jERYX4000HK, jERYX8800 produced by Japan Epoxy Resins Co., Ltd.; product names TEPIC-G, TEPIC-P, TEPIC-S, TEPIC-SP produced by Nissan Chemical industries, Ltd.; and product name GTR-1800 produced by Nippon Kayaku Co., Ltd.

Note there that "the (b1) epoxy resin is present in the B component in a solid state at a room temperature (25° C.)" means that an epoxy resin which is in a solid state at a room temperature (25° C.) does not totally dissolve in the B component and all of or a part of the epoxy resin is present in the B component in a solid state. Further, it is possible to check, by use of a gauge specified in JIS K 5600-2-5, whether the epoxy resin is present in the B component in a solid state.

The (B) compound having a reactive group which is reactive to a carboxyl group is preferably contained by 0.5 to 100 parts by weight where the (A) compound having a carboxyl group is 100 parts by weight because it is possible to increase heat resistance, chemical resistance, and electrical insulation reliability of a cured film obtained by curing the photosensitive resin composition.

In a case where the (B) compound having a reactive group which is reactive to a carboxyl group is contained in an amount less than the above range, it would possibly become difficult to achieve an effect which is attained by adding the (B) compound having a reactive group which is reactive to a carboxyl group. On the other hand, in a case where the (B) compound having a reactive group which is reactive to a carboxyl group is contained too much, productivity would be possibly decreased due to excess viscosity of a coating film obtained by applying the photosensitive resin composition on a substrate and drying the photosensitive resin composition thus applied. Further, a cured film to be obtained would possibly become fragile and easily break because a crosslink density is increased too much.

<(C) Oxime Ester Photopolymerization Initiator>

The (C) oxime ester photopolymerization initiator of the present invention has, in its molecule, at least one oxime ester structure represented by the following general formula (1):

[Chem. 1]

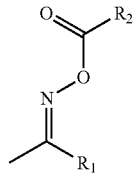

general formula (1)

where $R_1$ and $R_2$ each independently denote hydrogen, an alkyl group (which is unsubstituted or substituted with a hydroxyl group, and may have one or more intervening oxygen atoms in its alkyl chain), a cycloalkyl group, an alkanoyl group, a benzoyl group (which is unsubstituted or substituted with an alkyl group or a phenyl group), or a phenyl group (which is unsubstituted or substituted with an alkyl group, a phenyl group, or a halogen atom). The (C) oxime ester photopolymerization initiator is a compound which is activated by energy such as UV and starts and promotes a reaction on a radical polymer group. Further, the (C) oxime ester photopolymerization initiator is contained in the B component other than the A component containing the (A) compound having a carboxyl group. Due to such a structure, the (C) is prevented from deteriorating and thus does not suffer decrease in photosensitivity because the (A) is not in contact with the (C) for a long period. Therefore, the storage stability of the photosensitive resin composition production kit is increased.

The (C) oxime ester photopolymerization initiator is not limited in particular, and can be: 1,2-octane dione,1-[4-(phenylthio)-,2-(O-benzoyloxime)]; ethanone,1-[9-ethyl-6-(2-methylbenzoil)-9H-carbazole-3-yl]-, 1-(O-acetyl oxyom); (acetyloxyiminomethyl)thioxanthene-9-on or the like.

The (C) oxime ester photopolymerization initiator is preferably contained by 0.01 to 50 parts by weight where the (A) compound having a carboxyl group is 100 parts by weight. It is preferable to contain the (C) oxime ester photopolymerization initiator in such a ratio because the photosensitivity of the photosensitive resin composition is increased. In a case where the (C) is contained in an amount less than the above range, it would possibly become difficult to cause a reaction on a radical polymer group by irradiation with light, so that the photosensitive resin composition may not be cured sufficiently. On the other hand, in a case where the (C) is contained in an amount more than the above range, it would possibly become difficult to control an amount of irradiation light. This may cause the photosensitive resin composition to be exposed too much. Therefore, it is preferable to adjust the (C) oxime ester photopolymerization initiator so as to be in the above range in order to effectively carry out a photo-curing reaction.

<(D) Compound Having a Photosensitive Group but No Carboxyl Group>

The (D) compound having a photosensitive group but no carboxyl group of the present invention is a compound which substantially has no carboxyl group but has a radical polymer group in its molecule. The radical polymer group undergoes a polymerization reaction by a radical polymerization initiator. Further, the (D) compound having a photosensitive group but no carboxyl group is contained in the B component together with the (C) oxime ester polymerization initiator. Due to such a structure, the (D) acts as a solvent which dissolves the (C), and thus the solubility of the (C) in the B component is increased. Therefore, even in a case where the photosensitive resin composition production kit is stored for a long period under a low-temperature environment, the (C) which is dissolved in the B component is prevented from recrystallizing and precipitating in a composition (the B component).

The (D) compound having a photosensitive group but no carboxyl group is preferably a resin having at least one unsaturated double bond in its molecule. Furthermore, the unsaturated double bond is preferably a (meth)acryloyl group or a vinyl group.

Examples of the (D) compound having a photosensitive group but no carboxyl group is not limited to any particular one, but preferably encompass: bisphenol F EO-modified (n=2 through 50) diacrylate; bisphenol A EO-modified (n=2 through 50) diacrylate; bisphenol S EO-modified (n=2 through 50) diacrylate; bisphenol F EO-modified (n=2 through 50) dimethacrylate; bisphenol A EO-modified (n=2 through 50) dimethacrylate; bisphenol S EO-modified (n=2 through 50) dimethacrylate; 1,6-hexanediol diacrylate; neopentyl glycol diacrylate; ethylene glycol diacrylate; pentaerythritol diacrylate; trimethylolpropane triacrylate; pentaerythritol triacrylate; dipentaerythritol hexaacrylate; tetramethylolpropane tetraacrylate; tetraethylene glycol diacrylate; 1,6-hexanediol dimethacrylate; neopentyl glycol dimethacrylate; ethylene glycol dimethacrylate; pentaerythritol dimethacrylate; trimethylolpropane trimethacrylate; pentaerythritol trimethacrylate; dipentaerythritol hexamethacrylate; tetramethylolpropane tetramethacrylate; tetraethylene glycol dimethacrylate; methoxy diethylene glycol methacrylate; methoxy polyethylene glycol methacrylate; 3-chloro-2-hydroxypropyl methacrylate; stearyl methacrylate; phenoxyethyl acrylate; phenoxydiethylene glycol acrylate; phenoxypolyethylene glycol acrylate, lauryl acrylate; ethylene glycol dimethacrylate; diethylene glycol dimethacrylate; triethylene glycol dimethacrylate; polyethylene glycol dimethacrylate; 1,3-butylene glycol dimethacrylate; 1,6-hexanediol dimethacrylate; neopentyl glycol dimethacrylate; polypropylene glycol dimethacrylate; 2-hydroxy-1,3-dimethacryloxypropane; 2,2-bis[(4-(methacryloxy ethoxy)phenyl)]propane; 2,2-bis[(4-(methacryloxy diethoxy)phenyl)]propane; 2,2-bis[(4-(methacryloxy polyethoxy)phenyl)]propane; polyethylene glycol diacrylate; tripropylene glycol diacrylate; polypropylene glycol diacrylate; 2,2-bis[(4-(acryloxy diethoxy)phenyl)]propane; 2,2-bis[(4-(acryloxy polyethoxy)phenyl)]propane; 2-hydroxy-1-acryloxy-3-methacryloxy propane; trimethylolpropane trimethacrylate; tetramethylolmethane trimethacrylate; tetramethylolmethane tetraacrylate; methoxy dipropylene glycol methacrylate; methoxy triethylene glycol acrylate; nonylphenoxy polyethylene glycol acrylate; nonylphenoxy polypropylene glycol acrylate; isostearyl acrylate; polyoxyethylene alkyl ether acrylate; nonylphenoxy ethylene glycol acrylate; polypropylene glycol dimethacrylate; 1,4-butanediol dimethacrylate; 3-methyl-1,5-pentanediol dimethacrylate; 1,6-mexanediol dimethacrylate; 1,9-nonanediol methacrylate; 2,4-diethyl-1,5-pentanediol dimethacrylate; 1,4-cyclohexanedimethanol dimethacrylate; dipropylene glycol diacrylate; tricyclodecane dimethanol diacrylate; 2,2-hydrogenated bis[4-(acryloxy polyethoxy)phenyl]propane; 2,2-bis [4-(acryloxy polypropoxy)phenyl]propane; 2,4-diethyl-1,5-pentanediol diacrylate; ethoxylated trimethylolpropane triacrylate; propoxylated trimethylolpropane triacrylate; isocyanuric acid tri(ethane acrylate); pentaerythritol tetraacrylate; ethoxylated pentaerythritol tetraacrylate; propoxylated pentaerythritol tetraacrylate; ditrimethylolpropane tetraacrylate; dipentaerythritol polyacrylate; isocyanuric acid triaryl; glycidyl methacrylate; glycidyl aryl ether; 1,3,5-triacryloyl hexahydro-s-triazine; 4,4'-isopropylidenediphenol dimethacrylate; and 4,4'-isopropylidenediphenol diacrylate. Particularly, it is preferable that a repeating unit of EO (ethylene oxide) included in one molecule of a diacrylate or a dimethacrylate be in a range of 2 to 50, further preferably in a range of 2 to 40. By using the (D) in which a repeating unit of EO is in a range of 2 to 50 improves solubility of the photosensitive resin composition in a water-based developing solution whose one typical example is an alkali aqueous solution. As a result, the amount of time required for development is shortened. Further, stress hardly remains in a cured film obtained by curing the photosensitive resin composition. Therefore, for example, in case where the cured film is laminated on a flexible printed wiring board in which its substrate is made from a polyimide resin, it is possible to avoid curling of the flexible printed wiring board. Further, because the solubility of the (C) oxime ester photopolymerization initiator is increased, the (C) which is dissolved in the B component is prevented from recrystallizing and precipitating in a composition (the B component) even in a case where the photosensitive resin composition production kit is stored for a long period under a low-temperature environment. Further, because a density of the photosensitive group in one molecule is low, a reaction of the photosensitive group does not easily proceed and thus the (D) excels in storage stability even in a case where the (D) is contained in the B component together with the (C) oxime ester photopolymerization initiator.

The (D) compound having a photosensitive group but no carboxyl group is preferably contained by 10 to 200 parts by weight where the (A) is 100 parts by weight because the photosensitivity of the photosensitive resin composition is increased.

In a case where the (D) is contained in an amount less than the above range, alkali resistance of a cured coating film obtained by photo-curing the photosensitive resin composition may be too low, and further contrast may not be easily obtained when the photosensitive resin composition is exposed to light and developed. On the other hand, in a case where the (D) is contained in an amount more than the above range, productivity would be possibly decreased due to excess viscosity of a coating film obtained by applying the photosensitive resin composition on a substrate and drying solvents of the photosensitive resin composition. Further a cured film to be obtained would possibly become fragile and easily break because a crosslink density is increased too much. Therefore, by containing the (D) in an amount in the above range, it becomes possible to cause a resolution to fall within the most suitable range as a result of light exposure and development.

<Other Compounds>

The photosensitive resin composition of the present invention may further contain any of various kinds of additives such as a flame retardant, a filler, an adhesive promotion agent, a defoaming agent, a leveling agent, a colorant, and a polymerization inhibitor if necessary. As the flame retardant, the photosensitive resin composition may contain, for example, a phosphoric acid ester compound, a halogen-based compound, a metalhydroxide, and an organic phosphorous compound. The photosensitive resin composition of the present invention may contain one of the additives solely, or two or more of the additives in combination. Further, it is preferable that a content of each of the above additives be selected as appropriate. Further, as the filler, the photosensitive resin composition may include a fine inorganic filler such as silica, mica, talc, barium sulphate, wollastonite, and calcium carbonate, or a fine organic polymer filler. Further, as the defoaming agent, for example a silicon-based compound or an acrylic-based compound may be included. As the leveling agent, a silicon-based compound, an acrylic-based compound or the like may be included. As the colorant, a phthalocyanine-based compound, an azo-based compound, carbon black, titanium oxide or the like may be included. As the adhesive promotion agent (also referred to as an adhesive additive), a silane coupling agent, a triazole-based compound, a tetrazole-based compound, a triazine-based compound or the like may be included. Further, as the polymerization inhibitor, for example, hydroquinone, hydroquinone monomethyl ether or the like may be included.

<Method for Mixing a Component and B Component>

The A component of the present invention is obtained for example by smashing, dispersing, and mixing the (A) compound having a carboxyl group, the other compounds, and an organic solvent. It is not limited in particular how to smash and disperse the foregoing components. The foregoing components can be smashed and dispersed by use of a general mixing device such as a bead mill, a ball mill, and a three-roll.

It is possible to measure a particle size of a particle contained in the A component with the use of a gauge specified by JIS K 5600-2-5. Further, it is possible to measure a mean particle size, a particle size, and particle distribution with the use of a particle distribution measuring device.

On the other hand, the B component of the present invention is obtained by smashing, dispersing, and mixing the (B) compound having a reactive group which is reactive to a carboxyl group, the (C) oxime ester photopolymerization initiator, the (D) compound having a photosensitive group but no carboxyl group, the other compounds, and an organic solvent. It is not limited in particular how to smash and disperse the forgoing components. The foregoing components can be smashed and dispersed by use of a general mixing device such as a bead mill, a ball mill, and a three-roll. It is possible to measure a particle size of a particle contained in the B component with the use of a gauge specified by JIS K 5600-2-5. Further, it is possible to measure a mean particle size, a particle size, and particle distribution with the use of a particle distribution measuring device.

(II) Use of Photosensitive Resin Composition Production Kit

The photosensitive resin composition production kit includes at least the A component and the B component which is a different composition from the A component. By directly using the photosensitive resin composition obtained by mixing the A component and the B component, it is possible to form a cured film or a relief pattern in the following manner. Alternatively, it is also possible to form a cured film or a relief pattern as follows after preparing a photosensitive resin composition solution by diluting the photosensitive resin composition with an organic solvent.

First, the photosensitive resin composition or the photosensitive resin composition solution which are obtained by mixing the A component and the B component is applied on a substrate and then dried so that organic solvents are removed. The photosensitive resin composition or the photosensitive resin composition solution can be applied on a substrate by screen printing, curtain roll, reverse roll, spray coating, or spin coating with the use of a spinner. A coating film thus obtained (preferable thickness: 5 to 100 μm, more preferable thickness: 10 to 100 μm) is dried at a temperature of no more than 120° C., preferably at a temperature in a range of 40 to 100° C.

Next, after the coating film is dried, the coating film thus dried is provided with a negative type photomask and irradiated with activating light such as ultraviolet rays, visible rays, and electron rays. Thereafter, an unexposed portion of the coating film is washed with a developing solution with the use of various methods such as uses of a shower, a puddle, immersion, and ultrasound so that a relief pattern is obtained. Note that, since a time required for exposing a pattern differs depending on (i) a spray pressure and/or a flow rate of a developing device and (ii) a temperature of an etchant, it is preferable to find a most suitable condition for the developing device as appropriate.

It is preferable to use, as the developing solution, an alkali aqueous solution, and the developing solution may contain a water-soluble organic solvent such as methanol, ethanol, n-propanol, isopropanol, and N-methyl-2-pyrrolidone. Examples of an alkaline compound which provides the alkali aqueous solution include hydroxides, carbonates, hydrogencarbonates, or amine compounds of for example alkaline metals, alkaline earth metals, or ammonium ion. Specific examples of the alkali aqueous solution include sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Any other compounds can be obviously used, provided that the any other compounds provide aqueous solutions which exhibit basicity. The concentration of the alkaline compound which can be preferably used for the developing process of the photosensitive resin composition of the present invention is preferably in a range of 0.01% to 20% by weight, and is more preferably in a range of 0.02% to 10% by weight. Further, a temperature of the developing solution depends on a component of the photosensitive resin composition or a component of an alkaline developing solution, and the developing solution is generally preferably used at a temperature in a range of not less than 0° C. and not more than 80° C., more generally in a range of not less than 10° C. and not more than 60° C.

The relief pattern formed in the developing process is rinsed so that excess remaining portions are removed. Water, acidic aqueous solution or the like can be used as a rinsing fluid.

Next, heat treatment is carried out on the resulting relief pattern. By carrying out a reaction on the reactive group remaining in a molecule structure by the heat treatment, it is possible to obtain a cured film excellent in heat resistance. The thickness of the cured film is determined depending on the thickness of wirings and the like, and is preferably approximate 2 to 50 μm. It is desirable that a final curing temperature be low to cure the relief pattern so as to prevent oxidation of the wirings and the like and to prevent a decrease in adhesion of the wirings to the substrate.

A curing temperature at this time is preferably in a range of not less than 100° C. and not more than 250° C., further preferably not less than 120° C. and not more than 200° C., and particularly preferably not less than 130° C. and not more than 180° C. It is not desirable that a final heating temperature is high because such a high temperature causes deterioration of the wirings due to oxidation thereof.

The cured film obtainable from the photosensitive resin composition of the present invention has excellent flame retardancy, heat resistance, chemical resistance, electrical and mechanical properties, and further has excellent flexibility.

Further, for example, the insulation film obtainable from the photosensitive resin composition preferably has a film thickness of approximate 2 to 50 μm and a resolution power of at least up to 10 μm, particularly approximate 10 to 1000 μm after photo-curing. Therefore, the insulation film obtainable from the photosensitive resin composition is particularly suitable as an insulating material of a high-density flexible substrate. Furthermore, the insulation film is used as various wiring coating protective materials of photo-curing type, photosensitive heat-resistant adhesives, insulating coating of electric wires and cables, and the like.

Note that, according to the present invention, it is possible to provide a similar insulating material by using the resin film obtained by applying the photosensitive resin composition or the photosensitive resin composition solution to a surface of a substrate and drying the photosensitive resin composition or the photosensitive resin composition solution thus applied.

It is possible to prepare the photosensitive resin composition by mixing at least two of the A component and the B component included in the photosensitive resin composition production kit of the present invention. Further, it is possible to produce the resin film by applying the photosensitive resin composition to a surface of a substrate and then drying the photosensitive resin composition thus applied. Furthermore, it is possible to produce the insulation film by curing the resin film by irradiation with light. In addition, it is possible to produce the printed wiring board with an insulation film by applying the photosensitive resin composition to a printed wiring board, then drying and photo-curing the photosensitive resin composition thus applied. According to the present invention, it is also possible to provide the photosensitive resin composition, the resin film, the insulation film, and the printed wiring board with an insulation film each of which is obtained in such a manner.

EXAMPLES

The following Examples describe the present invention more specifically. However, the present invention is not limited to such Examples.

(Synthesis 1)
<Synthesis 1 of (A) Compound Having a Carboxyl Group>
As a solvent for polymerization, 100.0 g of methyl triglyme (=1,2-bis(2-methoxyethoxy)ethane) was poured into a reactor vessel provided with a mixer, a thermometer, a dropping funnel, and a nitrogen introduction tube. The methyl triglyme was heated to 80° C. under stirring in a nitrogen stream. Into the methyl triglyme thus heated, 14.0 g of methacrylic acid, 38.0 g of ethyl acrylate, 38.0 g of methyl methacrylate, 10.0 g of styrene, and 0.4 g of azobisisobutyronitrile serving as a radical polymerization initiator, which were mixed at a room temperature beforehand, were dropped through the dropping funnel for three hours in a state where this mixture was kept heated at 80° C. After the dropping of the mixture was completed, a resulting reaction solution was heated to 90° C. under stirring, and was further stirred for two hours while the reaction solution was kept at 90° C. In this way, a compound solution having a carboxyl group but no photosensitive group of the present invention was obtained. According to the compound solution having a carboxyl group but no photosensitive group, a solid concentration was 50%, a weight average molecular weight was 71,000, and an acid value of a solid was 90 mgKOH/g. Note that the solid concentration, the weight average molecular weight, and the acid value were measured by the following methods.

<Solid Content>
The solid content was measured in accordance with JIS K 5601-1-2, where drying condition was 150° C.×1 hour.

<Weight Average Molecular Weight>
The weight average molecular weight was measured under the following condition.

Apparatus used: an equivalent to Tosoh HLC-8220GPC
Column: Tosoh TSK gel Super AWM-H (6.0 mm I.D.×15 cm)×2
Guard column: Tosoh TSK guard column Super AW-H
Carrier solution: 30 mM LiBr+20 mM $H_3PO_4$ in DMF
Flow rate: 0.6 mL/min
Column temperature: 40° C.
Detecting condition: R1: polarity (+), response (0.5 sec)
Sample concentration: Approximate 5 mg/mL
Control: PEG (polyethylene glycol)

<Acid Value>
The acid value was measured in accordance with JIS K 5601-2-1.

(Synthesis 2)
<Synthesis 2 of (A) Compound Having a Carboxyl Group>
As a solvent for polymerization, methyl triglyme (=1,2-bis(2-methoxyethoxy)ethane) (20.0 g) was poured into a separable flask under positive nitrogen pressure. To the methyl triglyme, 10.3 g (0.050 mol) of norbornene diisocyanate was added, and this mixture was heated to 80° C. so that the norbornene diisocyanate was dissolved. To a resulting solution, a solution in which 50.0 g (0.025 mol) of polycarbonate diol (product name PCDL T5652 produced by Asahi Kasei Co., Ltd., average molecular weight is 2000) was dissolved in methyl triglyme (50.0 g) was added over one hour. This solution thus obtained was heated for five hours at 80° C. under stirring. After an end of reaction of a reaction solution thus obtained, 31.02 g (0.100 mol) of 3,3',4,4'-oxydiphthalic acid dianhydride (hereinafter, referred to as "ODPA") and methyl triglyme (20.0 g) were added to the reaction solution thus obtained. After the ODPA and the methyl triglyme were added, the reaction solution was heated to 200° C. and reacted for three hours. As a result of the reaction, a compound solution having a carboxyl group but no photosensitive group was obtained. According to the compound solution having a carboxyl group but no photosensitive group thus obtained, a solid content was 50%, a weight average molecular weight was 9,000, and an acid value of a solid was 75 mgKOH/g. Note that the solid content, the weight average molecular weight, and the acid value were measured in the same way as Synthesis 1.

Examples 1 to 4, Comparative Example 1

An A component was produced by adding together a (A) compound having a carboxyl group obtained in Syntheses 1 to 2, a (C) oxime ester photopolymerization initiator, the other compounds, and 1,2-bis(2-methoxyethoxy)ethane which is an organic solvent. On the other hand, a B component was produced by adding a (B) compound having a reactive group which is reactive to a carboxyl group, a (C) oxime ester photopolymerization initiator, a (D) compound having a photosensitive group but no carboxyl group, the other compounds, and 1,2-bis(2-methoxyethoxy)ethane which is an organic solvent.

Table 1 shows (i) blending quantities based on resin solids of materials composing the above components and (ii) types of the materials. Note that, in Table 1, the amount of 1,2-bis (2-methoxyethoxy)ethane, which is an organic solvent, is a total amount of the solvents including the amount of the solvent contained in the resin solution thus synthesized. Here, the A component and the B component were individually mixed and dispersed by two passes through a three-roll. The A component and the B component thus obtained were examined, in accordance with a method described in JIS K 5600-2-5, as to a particle size with the use of a grind meter produced by YASUDA SEIKI SEISAKUSHO, Ltd. which grind meter has a 0 μm to 50 μm deep groove. As a result, it was found only in Example 4 that the (B) was in the B component in a solid state. A mixture rate for obtaining a mixture of the A component and the B component is as shown in Table 1. For example, according to Example 1, 140 g of the A component and 34 g of the B component were mixed.

<3> Product name of phosphazene compound (phosphorus flame retardant) produced by Otsuka Pharmaceutical Co., Ltd.
<4> Product name of liquid epoxy resin produced by Japan Epoxy Resins Co., Ltd.
<5> Product name of powder epoxy resin produced by Japan Epoxy Resins Co., Ltd.
<6> Product name of EO-modified (n=10) bisphenol A dimethacrylate produced by Hitachi Chemical Co., Ltd.

(i) Precipitation of (C) after Storage of B Component at Low-Temperature

The B component thus produced was stored at a low-temperature of 5° C. When predetermined days elapsed, the B component was visually observed as to whether or not the (C) precipitated, and determined in accordance with the following criterion.

Excellent: a B component in which no precipitations were generated when 300 days elapsed was evaluated as "excellent" and marked with a double circle in Table 2.

Good: a B component in which no precipitations were generated when 50 days elapsed was evaluated as "good" and marked with a circle.

TABLE 1

Unit: parts by weight

|  |  | Example 1 | Example 2 | Example 3 | Example 4 | Comparative Example 1 |
|---|---|---|---|---|---|---|
| A component |  |  |  |  |  |  |
| (A) | Synthesis 1 | 60.0 | 60.0 | — | — | 60.0 |
|  | Synthesis 2 | — | — | 60.0 | 60.0 | — |
|  | KAYARAD ZCR-1601H <1> | — | 10.0 | 10.0 | 10.0 | 10.0 |
| (C) | IRGACURE OXE-02 <2> | — | — | — | — | 1.0 |
| Others | SPB-100 <3> | 20.0 | 20.0 | 20.0 | 20.0 | 20.0 |
| Organic solvent | Methyl triglyme | 60.0 | 60.0 | 60.0 | 60.0 | 60.0 |
| Total of A component | | 140.0 | 150.0 | 150.0 | 150.0 | 151.0 |
| B component |  |  |  |  |  |  |
| (B) | j ER 828 <4> | 10.0 | 10.0 | 10.0 | — | 10.0 |
|  | j ER YX-4000K <5> | — | — | — | 10.0 | — |
| (C) | IRGACURE OXE-02 | 1.0 | 1.0 | 1.0 | 1.0 | — |
| (D) | FANCRYL FA-321M <6> | 10.0 | 10.0 | 10.0 | 10.0 | 10.0 |
| Organic solvent | Methyl triglyme | 13.0 | 13.0 | 13.0 | 13.0 | 13.0 |
| Total of B component | | 34.0 | 34.0 | 34.0 | 34.0 | 33.0 |

Explanations of <1> to <7> shown in Table 1 are as follows.

<1> Carboxyl group and photosensitive group containing resin (product name of a carboxyl group and photosensitive group containing resin produced by Nippon Kayaku Co., Ltd., solid content: 65%, acid value of solid: 98 mgKOH/g).
<2> Product name of oxime ester photopolymerization initiator produced by BASF Japan Ltd.

Fair: a B component in which no precipitations were generated when 10 days elapsed was evaluated as "fair" and marked with a triangle.
Poor: a B component in which precipitations were generated when 10 days elapsed was evaluated as "poor" and marked with a cross.

<Production of Coating Film on Polyimide Film>

A photosensitive resin composition obtained by mixing the A component and the B component was flow-cast and applied to a 100 mm×100 mm area on a polyimide film of 25 μm (produce name: 25 NPI produced by Kaneka Corporation) with the use of a Baker's applicator so that a final dried film thickness became 20 μm, and dried for 20 minutes at 80° C. After a negative photo mask was placed as appropriate, the photosensitive resin composition was exposed to irradiation with ultraviolet rays of a total exposure 300 mJ/cm². Next, a spray development was carried out on the photosensitive resin composition for 60 seconds at a discharge pressure of 1.0 kgf/mm² with the use of a solution which is a sodium carbonate aqueous solution of 1.0% by weight heated to 30° C. After the development, the photosensitive resin composition was sufficiently washed with pure water, then heated and cured in an oven at 150° C. for 60 minutes so as to form a cured film of the photosensitive resin composition.

<Evaluation of Photosensitive Resin Composition>

A coating film was produced by the foregoing method, and evaluated as to the following items. Results of the evaluation are shown in Table 2.

(ii) Storage Stability of Photosensitivity

By the same method as the one described in <Production of coating film on polyimide film>, a cured film of the photosensitive resin composition which cured film was 20 μm thick was formed on a surface of a polyimide film of 25 μm thickness (product name: Apical 25NPI, produced by Kaneka Corporation) so as to prepare a cured film laminated film. Development was carried out with a 21-step tablet photo mask (product name: T2115 produced by Stouffer Industries).

This 21-step tablet photo mask has regions of 1 to 21 steps in which regions light transmittance varies step-by-step from 0 to 100%. By exposing a photosensitive resin composition covered with this 21-step tablet photo mask, and examining to which steps the photosensitive resin composition is cured, it is possible to evaluate photosensitivity of the photosensitive resin composition.

In the present Examples, a reference value used was the step number of the step tablet photo mask scored by evaluation of the photosensitive resin composition obtained by mixing the A component and the B component which were before being stored at 40° C.

Further, the A component and the B component which were before being mixed were stored at 40° C. When predetermined days elapsed, similar evaluation was carried out. Thereafter, determination was made depending on the following criteria.

Excellent: a photosensitive resin composition in which the step number of the step tablet photo mask was in a range of plus or minus 1 with respect to the reference value when 300 days elapsed was evaluated as "excellent" and marked with a double circle.
Good: a photosensitive resin composition in which the step number of the step tablet photo mask was in a range of plus or minus 1 with respect to the reference value when 50 days elapsed was marked as "good" and marked with a circle.
Fair: a photosensitive resin composition in which the step number of the step tablet photo mask was in a range of plus or minus 1 with respect to the reference value when 10 days elapsed was evaluated as "fair" and marked with a triangle.
Poor: a photosensitive resin composition in which the step number of the step tablet photo mask was NOT in a range of plus or minus 1 with respect to the reference value when 10 days elapsed was evaluated as "poor" and marked with a cross.

(iii) Warpage

By the same method as the one described in <Production of coating film on polyimide film>, a cured film of the photosensitive resin composition which cured film was 20 μm thick was formed on a surface of a polyimide film of 25 μm thickness (product name: Apical 25NPI, produced by Kaneka Corporation) so as to prepare a cured film laminated film.

This cured film laminated film was cut so as to be a film of a 50 mm×50 mm area. The film was placed on a smooth table so that the coating film faced upward, and measured as to how much an end portion of the film was warped. FIG. 1 schematically illustrates a part to be measured. On a smooth table (3), a polyimide film (1) on which a photosensitive resin composition was layered was placed. Then, a distance between a plane surface of the smooth table (3) and an end portion of the film (see (2) shown in FIG. 1) was measured. This distance was assumed to be a warpage amount (warpage height). In a case where the warpage amount (warpage height) at the end portion was different from a warpage amount (warpage height) at the other end portion, a larger one was evaluated as a warpage amount (warpage height) of the film.

As the warpage amount on a surface of the polyimide film is smaller, stress on a surface of a printed wiring board is lower, and accordingly a warpage amount of the printed wiring board is smaller. The warpage amount is preferably not more than 5 mm. Note that, the film rolled is denoted with "x" (cross) in Table 2 (shown later).

(iv) Bending Resistance

By the same method as the one described in <Production of coating film on polyimide film>, a cured film of the photosensitive resin composition which cured film was 20 μm thick was formed on a surface of a polyimide film of 25 μm thickness (product name: Apical 25NPI, produced by Kaneka Corporation) so as to prepare a cured film laminated film. Bending resistance of the cured film laminated film was evaluated as below. That is, the cured film laminated film was cut so as to be a strip of 50 mm×10 mm. The strip was bended by an angle of 180° at a 25 mm point so that the cured film faced outside, and a load of 5 kg was put on a bending point for three seconds. Thereafter, the load was removed, and a top of the bending point was observed with the use of a microscope. After observation with the use of the microscope, the bending point was opened and the load of 5 kg was put thereon for three seconds. The load was then removed, and the cured film laminated film was completely opened. The above process was repeated, and the number of processes at which a crack appeared at the bending point was assumed to be the bending number.

(v) Flame Retardancy

In accordance with Test for Flammability of Plastic materials UL94VTM, a flammability test was conducted as below. By the same method as the one described in <Production of coating film on polyimide film>, a cured film of the photosensitive resin composition which cured film was 20 μm thick was formed on both surfaces of a polyimide film of 25 μm thickness (product name: Apical 12.5NPI, produced by Kaneka Corporation) so as to prepare a cured film laminated film. A sample thus produced was cut into a size of 50 mm wide, 200 mm high, and 75 μm thick (including a thickness of the polyimide film). At a 125 mm point of the sample, a benchmark was marked. The sample was rolled so as to be a tube of approximate 13 mm diameter, and a PI tape was attached to an overlapping portion above the benchmark (portion of 75 mm) and to an upper part so that no gap was found. Twenty tubes were prepared for the flammability test. Ten tubes out of the twenty tubes were treated under a condition of (1) 23° C./relative humidity of 50%/48 hours, and the other tubes were treated (2) for 168 hours at 70° C. and then cooled for more than 4 hours in a desiccator in which anhydrous calcium chloride was added. Each of these samples was vertically fixed by fastening the upper part with a clamp, and ignited by placing a flame of a burner close to a bottom part of the each of the samples for three seconds. After three seconds elapsed, the flame of the burner was removed, and the each of the samples was measured as to how many seconds later a flame or burning of the each of the samples died out.

Good: samples were evaluated as "good" and marked with a circle, in which samples a flame or burning automatically died out within 10 seconds on an average (average of 10 samples) and within 10 seconds at maximum and also the burning did not reach the benchmark after the flame of the burner was removed from the sample under each condition ((1) and (2)).

Poor: samples in which the flame or the burning of even one sample did not die out within 10 seconds, or the flame reached the benchmark and burned even one sample were evaluated as "poor" and marked with a cross.

(vi) Tackiness Property

By the same method as the one described in <Production of coating film on polyimide film>, the photosensitive resin composition was applied to a surface of a polyimide film of 25 μm thickness (product name: Apical 25NPI, produced by Kaneka Corporation), and dried so as to obtain a coating film of 20 μm thickness. The coating film thus obtained was folded so that a surface of the coating film overlapped with itself lightly, and was measured based on the following criteria.

Excellent: a coating film whose surface did not adhere to itself and showed no marks of adhesion was evaluated as "excellent" and marked with a double circle.

Good: a coating film whose surface did not adhere to itself and showed some marks of adhesion was evaluated as "good" and marked with a circle.

Fair: a coating film whose surface adhered to itself but easily separated was evaluated as "fair" and marked with a triangle.

Poor: a coating film whose surface adhered to itself and could not easily separate was evaluated as "poor" and marked with a cross.

(vii) Solder Heat Resistance

By the same method as the one described in <Production of coating film on polyimide film>, a cured film of the photosensitive resin composition which cured film was 20 μm thick was formed on a surface of a polyimide film of 75 μm thickness (product name: Apical 75NPI, produced by Kaneka Corporation) so as to prepare a cured film laminated film.

The coating film was floated, in a solder bath in which a solder was completely melted at 260° C., in such a manner that a surface on which the cured film of the photosensitive resin composition was formed was in contact with the solder bath. After 10 seconds later, the coating film was pulled up. This process was repeated three times, and the surface of the cured film laminated film was observed.

Good: a coating film which suffered no problems was evaluated as "good and marked with a circle.

Poor: a coating film which suffered problems such as swelling and peeling off was evaluated as "poor" and marked with a cross.

(viii) Resistance to Solvent

The cured film obtained in <Production of coating film on polyimide film> was evaluated as to its resistance to a solvent. The evaluation was carried out by immersing the cured film in a methyl ethyl ketone of 25° C. for 15 minutes, then air-drying the cured film, and observing a surface of the cured film.

Good: a coating film having no problems was evaluated as "good" and marked with a circle.

Poor: a coating film having problems such as swelling and peeling off was evaluated as "poor" and marked with a cross.

(ix) Electrical Insulation Reliability

On a flexible copper coated laminate (an electrolytic copper foil is 12 μm thick; a polyimide film is Apical 25NPI produced by Kaneka Corporation; the electrolytic copper is attached with the use of a polyimide adhesive), a comb-shaped pattern of line width/space width=100 μm/100 μm was formed. The flexible copper coated laminate provided with the comb-shaped pattern was immersed in a sulfuric acid aqueous solution of 10% by volume for one minute, and washed with pure water so as to surface-treat the electrolytic copper foil. Thereafter, by the same method as the one described in <Production of coating film on polyimide film>, a cured film of the photosensitive resin composition which cured film was 20 μm thick was formed on the comb-shaped pattern so as to prepare a specimen. In an environmental test device of 85° C. and of relative humidity of 85%, a direct current of 100 V was applied to both terminals on the specimen, and the specimen was observed as to changes in an insulation resistance value and as to migration and the like.

Good: a specimen was evaluated as "good" and marked with a circle, in which specimen a resistance value of not less than $10^8$ (10 to the power of 8) was observed in 1000 hours after start of the test and no migration or formation of dendrites occurred.

Poor: a specimen in which migration, formation of dendrites, or the like phenomenon was observed in 1000 hours after start of the test was evaluated as "poor" and marked with a cross.

Comparative Example 1

As in Examples, a photosensitive resin composition made of the A component and the B component was prepared. Table 1 shows (i) blending quantities based on resin solids of materials composing the above components and (ii) types of the materials. As in Examples, a particle size was examined, and the photosensitive resin composition thus obtained was evaluated by the same method as the one described in Examples. Results of the evaluation are show in Table 2.

Comparative Example 2

Into a reactor vessel provided with a mixer, a thermometer, a dropping funnel, and an air introduction tube, 217.0 g of a cresol novolac type epoxy resin (epoxy equivalent 217), 0.2 g of hydroquinone serving as a polymerization inhibitor, 1.0 g of triphenylphosphine serving as a catalyst, and 204.8 g of Carbitol acetate serving as a solvent for polymerization were poured, and heated to 80° C. under stirring in an air stream. Next, a resulting mixture was reacted for 16 hours under stirring by being kept heated at 85 to 105° C. while 72.0 g of acrylic acid was gradually added. Further, the mixture was caused to undergo an addition reaction with 91.2 g of tetrahydrophthalic acid anhydride, so that a (a2) compound solution having a carboxyl group and a photosensitive group was obtained. According to the (a2) compound solution having a carboxyl group and a photosensitive group, a solid content was 65%, and an acid value of a solid was 65 mgKOH/g. Note that the solid content and the acid value of a solid were measured by the same method as the one in Syntheses.

By mixing 100.0 g of the (a2) compound solution having a carboxyl group and a photosensitive group thus obtained, 10.0 g of dipentaerythritol hexaacrylate serving as a (D), 1.0 g of a defoaming agent (product name: FLOWEN AC-300 produced by Kyoei Chemical Co., Ltd.), 80.0 g of barium sulphate, and 0.5 g of copper phthalocyanine green, an A component was prepared. On the other hand, a B component was prepared by mixing: 20.0 g of a cresol novolac type epoxy resin (product name: EOCN1020 produced by Nippon Kayaku Co., Ltd.) and 10.0 g of a bisphenol A type epoxy resin (product name: jER828 produced by Japan Epoxy Resins Co., Ltd.) each of which serves as a (B); 5.0 g of (acetyloxyiminomethyl)thioxanthene-9-on (product name of an oxime ester photopolymerization initiator: CGI-325 produced by BASF Japan Ltd.) serving as a (C); 1.0 g of diethyl thioxanthone (product name: KAYACURE DETX-S produced by Nippon Kayaku Co., Ltd.); and 2.5 g of 4-dimethyl aminobenzoic acid ethyl ester (product name: KAYACURE EPA produced by Nippon Kayaku Co., Ltd.). The A component and the B component were mixed so as to prepare a photosensitive resin composition. As in Examples, a particle size was examined, and evaluation was conducted, by the same methods as those described in Examples, as to precipitation of the (C) after the B component was stored at a low temperature and as to the photosensitive resin composition obtained by mixing 191.5 g of the A component and 38.5 g of the B component. Results of the evaluation are shown in Table 2.

Comparative Example 3

An A component was produced by mixing: 30.0 g of a liquid phenoxy phosphazene derivative (product name: FP-390 produced by FUSHIMI Pharmaceutical Co., Ltd.); 150.0 g of a compound solution having a carboxyl group and a photosensitive group (product name of a carboxyl group containing photosensitive urethane resin: P7M50 produced by Kyoei Chemical Co., Ltd., a solid content: 50%, an acid value of a solid: 50 mgKOH/g) and 38.0 g of a compound solution having a carboxyl group and a photosensitive group (product name of a carboxyl group containing photosensitive resin: ZCR-1601H produced by Nippon Kayaku Co., Ltd., a solid content: 65%, an acid value of a solid: 98 mgKOH/g) each of which serves as a (a2); 20.0 g of lactone-modified hexaacrylate of dipentaerythritol (product name: KAYARAD DPCA-60 produced by Nippon Kayaku Co., Ltd.) and 23.0 g of phosphorus containing compound-modified acrylate (product name: HFA-6065E produced by SHOWA HIGH-POLYMER Co., Ltd.) each of which serves as a (D); 5.0 g of melamine; 40.0 g of silica (product name: Admafine SO-E2 produced by Admatechs Company Limited); 5.0 g of dipropylene glycol monomethyl ether; 3.0 g of silicon defoaming agent; and 1.1 g of pigment.

A B component was produced by mixing: 10.0 g of a photopolymerization initiator (product name: IRUGACURE907 produced by BASF Japan Ltd.); 0.5 g of (acetyloxyiminomethyl)thioxanthene-9-on (product name of an oxime ester photopolymerization initiator: CGI-325 produced by BASF Japan Ltd.) and 0.5 g of ethanone,1-[9-ethyl-6-(2-methylbenzoyl)-9H-carbazol-3-yl]-,1-(O-acethyloxime) (product name of an oxime ester photopolymerization initiator: IRGACURE OXE-02 produced by BASF Japan Ltd.) each of which serves as a (C); and 60.0 g of a bisphenol novolac-type epoxy resin (product name: NC-3000H produced by Nippon Kayaku Co., Ltd., a solid content: 70%) serving as a (B).

By mixing the A component and the B component together, a photosensitive resin composition was produced. As in Examples, a particle size was examined, and evaluation was conducted, by the same methods as those described in Examples, as to precipitation of the (C) after the B component was stored at a low temperature and as to the photosensitive resin composition obtained by mixing 315.1 g of the A component and 71 g of the B component. Results of the evaluation are shown in Table 2.

TABLE 2

| Evaluation items | Example 1 | Example 2 | Example 3 | Example 4 | Comparative Example 1 | Comparative Example 2 | Comparative Example 3 |
|---|---|---|---|---|---|---|---|
| Precipitation of (C) after storage of B component at low-temperature | ◎ | ◎ | ◎ | ◎ | — | X | X |
| Storage stability of photosensitivity | ○ | ○ | ○ | ◎ | X | ○ | ○ |
| Warpage (mm) | 1 | 3 | 2 | 2 | 3 | X | 10 |
| Bending resistance (number) | 20 | 10 | 20 | 20 | 10 | 0 | 3 |
| Flame retardancy | ○ | ○ | ○ | ○ | ○ | X | ○ |
| Tackiness Property | ○ | ○ | ○ | ◎ | ○ | ○ | ○ |
| Solder heat resistance | ○ | ○ | ○ | ○ | ○ | ○ | ○ |
| Resistance to solvent | ○ | ○ | ○ | ○ | ○ | ○ | ○ |
| Electrical insulation reliability | ○ | ○ | ○ | ○ | ○ | ○ | ○ |

INDUSTRIAL APPLICABILITY

As has been described, the present invention relates to: (i) a photosensitive resin composition production kit which has excellent storage stability in a long-term storage; (ii) a photosensitive resin composition obtainable by use of the photosensitive resin composition production kit, which photosensitive resin composition is excellent in microfabricability, developability, and low-temperature curability per se, excellent in flexibility, electrical insulation reliability, solder heat resistance, resistance to an organic solvent, and flame retardancy when processed into a cured film, and low in post-curing warpage when processed into a substrate; and (iii) a resin film, an insulation film, and a printed wiring board with an insulation film each of which is obtainable from the photosensitive composition.

It is possible to preferably employ the present invention for an industry in which a photosensitive resin composition is used, particularly for an industry in which a printed circuit board is used.

REFERENCE SIGNS LIST

1 Polyimide film on which photosensitive resin composition is layered
2 Warpage amount (height of warpage)
3 Smooth table

The invention claimed is:

1. A photosensitive resin composition production kit comprising at least two or more components including an A component and a B component,
 the A component containing a (A) compound having a carboxyl group,
 the B component containing a (B) compound having a reactive group which is reactive to a carboxyl group, a (C) oxime ester photopolymerization initiator, and a (D) compound having a photosensitive group but no carboxyl group,
 wherein the A component and B component are separate.

2. The photosensitive resin composition production kit as set forth in claim 1, wherein the (A) compound having the carboxyl group includes at least one of a (a1) compound having a carboxyl group but no photosensitive group and a (a2) compound having a carboxyl group and a photosensitive group.

3. The photosensitive resin composition production kit as set forth in claim 1, wherein the (B) compound having a reactive group which is reactive to a carboxyl group is a (b1) epoxy resin.

4. The photosensitive resin composition production kit as set forth in claim 3, wherein at a room temperature (25° C.), the (b1) epoxy resin is in a solid state in the B component.

5. The photosensitive resin composition production kit as set forth in claim 1, wherein the (A) compound having a carboxyl group has such a structure that the carboxyl group is directly bound to an aromatic ring.

6. A method for producing a resin film by use of a photosensitive resin composition production kit recited in claim 1, comprising:
 applying, to a surface of a substrate, a mixture containing the at least two components including the A component and the B component; and then
 drying the mixture.

7. A method for storing compounds which compose a photosensitive resin composition and which include at least a (A) compound having a carboxyl group, a (B) compound having a reactive group which is reactive to a carboxyl group, an (C) oxime ester photopolymerization initiator, and a (D) compound having a photosensitive group but no carboxyl group, comprising:
 preparing two or more components including (i) an A component containing a (A) compound having a carboxyl group and (ii) a B component containing a (B) compound having a reactive group which is reactive to a carboxyl group, an (C) oxime ester photopolymerization initiator, and a (D) compound having a photosensitive group but no carboxyl group; and
 storing the two or more components in such a way that at least the A component and the B component are stored separately from each other.

\* \* \* \* \*